US012757519B2

(12) United States Patent
Li et al.

(10) Patent No.: US 12,757,519 B2
(45) Date of Patent: Oct. 6, 2026

(54) PHOTOVOLTAIC CELL AND PREPARATION METHOD THEREOF, AND PHOTOVOLTAIC MODULE

(71) Applicants: Jinko Solar (Shangrao) Co., Ltd., Shangrao (CN); ZHEJIANG JINKO SOLAR CO., LTD., Haining (CN)

(72) Inventors: Wenqi Li, Shangrao (CN); Xiangyun Zhao, Shangrao (CN); Shijie Zhao, Shangrao (CN); Jie Yang, Shangrao (CN); Peiting Zheng, Shangrao (CN); Xinyu Zhang, Shangrao (CN)

(73) Assignees: Jinko Solar (Shangrao) Co., Ltd., Shangrao (CN); ZHEJIANG JINKO SOLAR CO., LTD., Haining (CN)

( * ) Notice: Subject to any disclaimer, the term of this patent is extended or adjusted under 35 U.S.C. 154(b) by 0 days.

(21) Appl. No.: 19/184,859

(22) Filed: Apr. 21, 2025

(65) Prior Publication Data

US 2026/0059894 A1 Feb. 26, 2026

(30) Foreign Application Priority Data

Aug. 23, 2024 (CN) ......................... 202411170197.3

(51) Int. Cl.
*H10F 77/20* (2025.01)
*H10F 77/30* (2025.01)
*H10F 77/70* (2025.01)

(52) U.S. Cl.
CPC ......... *H10F 77/215* (2025.01); *H10F 77/311* (2025.01); *H10F 77/703* (2025.01)

(58) Field of Classification Search
CPC .... H10F 77/211; H10F 77/215; H10F 77/219; H10F 77/311; H10F 77/70; H10F 77/703; H10F 77/707
See application file for complete search history.

(56) References Cited

U.S. PATENT DOCUMENTS 11,605,750 B2 3/2023 Swanson et al.
2007/0256733 A1* 11/2007 Karakida .............. H10F 77/211 136/256

(Continued)

FOREIGN PATENT DOCUMENTS

CN 116144302 A * 5/2023 ........... H10F 10/166
CN 116632106 A 8/2023

(Continued)

OTHER PUBLICATIONS

English machine translation of Zhang et al. (CN 116144302) published May 23, 2023.*

(Continued)

*Primary Examiner* — Christina Chern
(74) *Attorney, Agent, or Firm* — Ballard Spahr LLP

(57) ABSTRACT

The embodiments of the present disclosure relate to the photovoltaic field and provide a photovoltaic cell and a preparation method thereof, and a photovoltaic module. The photovoltaic cell includes: a substrate having a first surface; a passivation layer located on the first surface, the passivation layer has a groove exposing the first surface, and the passivation layer has a side wall forming the groove; and a grid line extending along a first direction, the grid line is at least partially located in the groove and is in ohmic contact with a part of the first surface exposed by the groove, and a gap is formed between the grid line at least partially located in the groove and the side wall along the first direction. A material of the grid line includes a low-fire-through conductive material.

17 Claims, 8 Drawing Sheets

(56) References Cited

U.S. PATENT DOCUMENTS

| | | | | |
|---|---|---|---|---|
| 2010/0300514 | A1* | 12/2010 | Denda | H10F 77/215 438/98 |
| 2011/0011440 | A1* | 1/2011 | Hioki | H10F 19/902 136/244 |
| 2015/0024541 | A1* | 1/2015 | Jaffrennou | H10F 77/211 438/72 |
| 2015/0380571 | A1* | 12/2015 | Shin | H10F 19/902 136/244 |
| 2021/0249551 | A1* | 8/2021 | Swanson | H10F 77/703 |
| 2022/0344528 | A1 | 10/2022 | Zhang et al. | |

FOREIGN PATENT DOCUMENTS

| | | | |
|---|---|---|---|
| CN | 219457630 | U | 8/2023 |
| CN | 117790632 | A | 3/2024 |
| CN | 112670355 | B | 6/2024 |
| CN | 118173627 | A | 6/2024 |
| EP | 3588583 | A1 | 1/2020 |

OTHER PUBLICATIONS

Extended European Search Report for European Application No. 25170516.6 mailed Sep. 23, 2025.

Höffler et al. "Enlarged firing window 13,14 and efficiency boosting of PERC solar cells by 'laser enhanced contact optimization' (LECO)" AIP Conf. Proc. (Siliconpv 2021, the 11th International Conference on Crystalline Silicon Photovoltaics), vol. 2487, Aug. 24, 2022, pp. 110001-1, XP093157420, DOI: 10.1063/5.0089264.

Nakamura et al. "Newly Developed Ag Coated Cu Paste for Si Hetero-Junction Solar Cell", 35th EU PVSEC 2018, Sep. 28, 2018, pp. 704-706, XP093313888, DOI: 10.4229/35thEUPVSEC20182018-2AV.3.37 Retrieved from the Internet: URL:https://userarea.eupvsec.org/proceedings/35th-EU-PVSEC-2018/2AV.3.37/ [retrieved on Sep. 11, 2025].

* cited by examiner

PHOTOVOLTAIC CELL AND PREPARATION METHOD THEREOF, AND PHOTOVOLTAIC MODULE

CROSS-REFERENCE TO RELATED APPLICATIONS

This application claims priority of Chinese Patent Application No. 202411170197.3, filed on Aug. 23, 2024, entitled "PHOTOVOLTAIC CELL AND PREPARATION METHOD THEREOF, AND PHOTOVOLTAIC MODULE", the entire content of which is incorporated herein by reference in its entirety.

TECHNICAL FIELD

The embodiments of the present disclosure relate to the photovoltaic field, particularly to a photovoltaic cell and a preparation method thereof, and a photovoltaic module.

BACKGROUND

Photovoltaic power generation refers to the conversion of solar energy into electrical energy through the photovoltaic effect of semiconductors. In order to transmit and collect the generated photogenerated carriers, a grid line is formed in solar cells. On the basis of providing the grid line, a passivation layer is also provided on a surface of a substrate of the photovoltaic cell in order to improve the photoelectric conversion efficiency of the photovoltaic cell.

However, an anti-reflection layer located on the surface of the substrate of the photovoltaic cell will adversely affect the contact performance between the grid line and the substrate, and the design of the anti-reflection layer and the grid line also needs to consider the cost issue. Accordingly, how to balance between the anti-reflection effect of the anti-reflection layer on the photovoltaic cell and the contact performance between the grid line and the substrate is an urgent problem to be solved.

SUMMARY

A photovoltaic cell and a preparation method thereof, and a photovoltaic module are provided according to the embodiments of the present disclosure, which are at least beneficial to improve the photoelectric conversion efficiency of the photovoltaic cell while reducing the preparation cost of the photovoltaic cell.

According to some embodiments of the present disclosure, in one aspect, a photovoltaic cell is provided, including: a substrate having a first surface; a passivation layer located on the first surface, the passivation layer has a groove exposing the first surface, and the passivation layer has a sidewall forming the groove; and a grid line extending along a first direction, the grid line is at least partially located in the groove and is in ohmic contact with a part of the first surface exposed by the groove, and a gap is formed between the grid line at least partially located in the groove and the side wall along the first direction. A material of the grid line includes a low-fire-through conductive material.

In some embodiments, taking a plane where the first surface is located as a reference plane, an angle between the side wall and the reference plane is 45° to 150°; and/or a surface roughness of the side wall is less than or equal to 6.3 μm; and/or the gap is formed between any grid line located in the groove and the side wall.

In some embodiments, the low-fire-through conductive material includes copper and silver, a content of copper in the low-fire-through conductive material is a first content, a content of silver in the low-fire-through conductive material is a second content, and a ratio of the first content to the second content is in a range from 1 to 9.

In some embodiments, along a second direction perpendicular to the first direction, a first width of the grid line is less than a second width of the groove.

In some embodiments, the grid line extends along the first direction, the grid line has two end portions and a middle portion connecting the two end portions along the first direction. In a direction along which the substrate points to the grid line, an area of the groove corresponding to the end portion is a first sub-groove, and an area of the groove corresponding to the middle portion is a second sub-groove. Along a second direction perpendicular to the first direction, a first sub-width of the end portion is greater than or equal to a second sub-width of the middle portion; and/or a third sub-width of the first sub-groove is greater than or equal to a fourth sub-width of the second sub-groove.

In some embodiments, the passivation layer has a plurality of grooves spaced apart along the first direction, the grid line is located in the plurality of grooves. A first spacing is formed between adjacent two grooves along the first direction, and a ratio of a first length of the groove in the first direction to the first spacing ranges from 1/40 to 10/1.

In some embodiments, the grid line includes a bottom portion, a transition portion, and a top portion that are sequentially connected in a direction along which the substrate points to the grid line. The bottom portion is in ohmic contact with the first surface and includes silver crystallites, the transition portion includes silver particles, the top portion includes silver-coated copper particles, and a size of the silver crystallites is less than a size of the silver particles.

According to some embodiments of the present disclosure, in another aspect, a preparation method of a photovoltaic cell is further provided, including: providing a substrate having a first surface; forming an initial passivation layer covering the first surface; removing a part of the initial passivation layer by a laser film removing process to form a groove exposing the first surface on the initial passivation layer, in which remaining initial passivation layer serves as a passivation layer, and the passivation layer has a sidewall forming the groove; printing a low-fire-through paste at least in the groove by a first screen printing process; and subjecting the low-fire-through paste to a laser-enhanced contact optimization treatment to transform the low-fire-through paste into a grid line in ohmic contact with a part of the first surface exposed by the groove, in which a gap is formed between the grid line at least partially located in the groove and the sidewall along a first direction.

In some embodiments, after the first screen printing process and prior to the laser-enhanced contact optimization treatment, a contact resistivity between the low-fire-through paste and the first surface is a first resistivity. After the laser-enhanced contact optimization treatment, a contact resistivity between the low-fire-through paste and the first surface is a second resistivity. The second resistivity is less than the first resistivity. In the step of the laser-enhanced contact optimization treatment, a contact resistivity between the low-fire-through paste and the first surface is reduced from the first resistivity to the second resistivity.

According to some embodiments of the present disclosure, in yet another aspect, the embodiments of the present disclosure further provide a photovoltaic module, including: a cell string formed by connecting a plurality of photovoltaic cells of any one of the foregoing, or formed by connecting a plurality of photovoltaic cells prepared by the preparation method of any one of the foregoing; a packaging film configured to cover a surface of the cell string; and a cover plate configured to cover a surface of the packaging film away from the cell string.

The technical solutions provided according to the embodiments of the present disclosure have at least the following advantages:

Firstly, the material for designing the grid line includes the low-fire-through conductive material, the preparation cost of the photovoltaic cell is reduced by taking advantage of the fact that the cost of the low-fire-through conductive material is lower than that of the high-fire-through conductive material. Secondly, a groove is designed in the passivation layer to expose the first surface of the substrate, and the size of the groove is designed to be greater than the size of the part of the grid line located in the groove, that is, a gap is formed between the part of the grid line located in the groove and the sidewall forming the groove on the passivation layer. In other words, not only the passivation layer and the grid line are located on the first surface, but a gap exposing a part of the first surface is formed between the passivation layer and the part of the grid line located in the groove. In this way, along the first direction, the entire width of the grid line can be in ohmic contact with the first surface, which is beneficial to ensure sufficient ohmic contact area between the grid line and the first surface by virtue of the groove with a greater size. Furthermore, based on the size design of the groove and the grid line, the entire width of the grid line along the first direction can be in ohmic contact with the first surface, so there is no need to increase the volume of the grid line (for example, divide the grid line into two parts with different widths in the first direction) to improve the conductivity of the grid line, which is beneficial to ensure good conductivity between the grid line and the first surface while further reducing the preparation cost of the grid line by reducing the volume of the grid line.

Furthermore, based on the fact that the low-fire-through conductive material has very weak corrosion and fire-through performance, the thickness of the passivation layer can be thinned, which is not only beneficial to reduce the preparation cost of the passivation layer, but also beneficial to reduce the parasitic absorption of light by the passivation layer. Therefore, in the photovoltaic cell provided according to the embodiments of the present disclosure, by virtue of the passivation layer with groove and the grid line including the low-fire-through conductive material, it is at least beneficial to improve the photoelectric conversion efficiency of the photovoltaic cell while reducing the preparation cost of the photovoltaic cell.

BRIEF DESCRIPTION OF THE DRAWINGS

One or more embodiments are exemplarily illustrated by corresponding drawings in the accompanying drawings. These exemplary descriptions should not be constructed as a limit to the embodiments. Unless otherwise specified, the drawings in the accompanying drawings should not be constructed as a scale limitation. To illustrate the technical solutions according to the embodiments of the present disclosure or in the prior art more clearly, the accompanying drawings required for use in the embodiments are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

Figure 1:
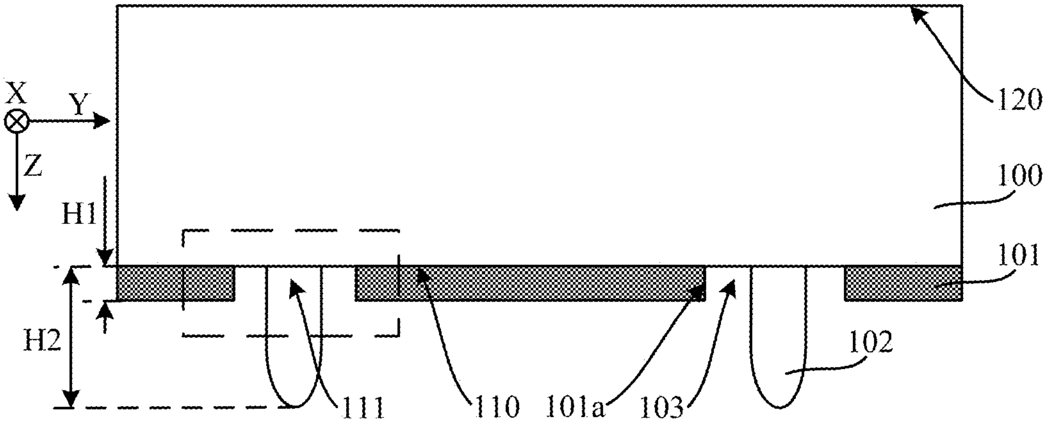
FIG. 1 is a first partial cross-sectional view of a photovoltaic cell according to an embodiment of the present disclosure.

As can be seen from the background, the photoelectric conversion efficiency of the photovoltaic cell needs to be improved, and the preparation cost of the photovoltaic cell also needs to be reduced.

It has been found by analysis that one of the reasons for the low photoelectric conversion efficiency of existing solar cells is that a high-fire-through conductive material is usually used to prepare the grid line in order to achieve the ohmic contact between the grid line and the substrate surface. On the one hand, when the grid line prepared by the high-fire-through conductive material is subjected to high-temperature sintering and annealing, the high-fire-through conductive material is prone to excessively corrode the passivation layer, thus the resulting grid line destroy the original passivation layer to a large extent, thereby affecting the performance of the passivation layer. On the other hand, based on the high-fire-through property of the high-fire-through conductive material, the high-fire-through conductive material used to form the grid line will be partially lost and cannot be used as a component of the grid line, resulting in fewer conductive grains formed in the final grid line, which limits the carrier transmission and is not conducive for the grid line to collect photocurrent, thereby limiting the photoelectric conversion efficiency of solar cells.

A semiconductor structure is provided according to the embodiments of the present disclosure, in which a material of a grid line includes a low-fire-through conductive material, which can reduce the preparation cost of the photovoltaic cell. Based on this, a groove is designed in a passivation layer to expose a first surface of a substrate, and a gap is formed between a part of the grid line located in the groove and a sidewall forming the groove on the passivation layer. In this way, along the first direction, the entire width of the grid line can be in ohmic contact with the first surface, which is beneficial to ensure sufficient ohmic contact area between the grid line and the first surface by virtue of the groove with a greater size. Furthermore, the entire width of the grid line along the first direction can be in ohmic contact with the first surface, so there is no need to increase the volume of the grid line (for example, divide the grid line into two parts with different widths in the first direction) to improve the conductivity of the grid line, which is beneficial to ensure good conductivity between the grid line and the first surface while further reducing the preparation cost of the grid line by reducing the volume of the grid line. Furthermore, based on the fact that the low-fire-through conductive material has very weak corrosion and fire-through performance, the thickness of the passivation layer can be thinned, which is not only beneficial to reduce the preparation cost of the passivation layer, but also beneficial to reduce the parasitic absorption of light by the passivation layer. Therefore, in the photovoltaic cell provided according to the embodiments of the present disclosure, by virtue of the passivation layer with groove and the grid line including the low-fire-through conductive material, it is at least beneficial to improve the photoelectric conversion efficiency of the photovoltaic cell while reducing the preparation cost of the photovoltaic cell.

In the description of the embodiments of the present disclosure, the technical terms "first", "second", etc. are only used to distinguish different objects, and cannot be understood as indicating or implying relative importance or implicitly indicating the number, specific order or primary and secondary relationship of the indicated technical features. In the description of the embodiments of the present disclosure, the meaning of "a plurality of" is at least two, unless otherwise clearly and specifically defined.

Reference to "embodiments" herein means that a particular feature, structure, or characteristic described in conjunction with the embodiment may be included in at least one embodiment of the present disclosure. The appearance of the phrase in various locations in the specification does not necessarily refer to the same embodiment, nor is it an independent or alternative embodiment that is mutually exclusive with other embodiments. It is explicitly and implicitly understood by those skilled in the art that the embodiments described herein may be combined with other embodiments.

In the description of the embodiments of the present disclosure, the term "and/or" is only a description of the association relationship of associated objects, indicating that three relationships may exist. For example, A and/or B can represent: A exists alone, A and B exist at the same time, and B exists alone. In addition, the character "/" herein generally indicates that the associated objects before and after are in an "or" relationship.

In the description of the embodiments of the present disclosure, the term "a plurality of" refers to more than two (including two). Similarly, "a plurality of groups" refers to more than two groups (including two groups), and "a plurality of pieces" refers to more than two pieces (including two pieces).

In the description of the embodiments of the present disclosure, the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise", "axial", "radial", "circumferential", etc. indicate an orientation or a positional relationship based on an orientation or a positional relationship shown in the drawings, which are only for the convenience of describing the embodiments of the present disclosure and simplifying the description, and do not indicate or imply that the referred device or element must have a specific orientation, be constructed and operated in a specific orientation, and therefore should not be understood as a limitation on the embodiments of the present disclosure.

In the description of the embodiments of the present disclosure, unless otherwise explicitly specified and defined, the technical terms "mounted", "coupled", "connected" and "fixed" should be understood broadly, for example, it could be understood as a fixed connection, or a detachable connection, or integrated; or it could be understood as a mechanical connection, or an electrical connection; it could be understood as a direct connection, an indirect connection through an intermediate medium; and it could be understood as an internal connection between two elements, or an interaction between two elements. For those of ordinary skill in the art, the specific meanings of the aforementioned terms in the embodiments of the present disclosure can be understood according to specific situations.

In the drawings corresponding to the embodiments of the present disclosure, the thickness and area of the layers are enlarged for better understanding and convenience of description. When it is described that a component (such as a layer, film, region or substrate) is on another component or on the surface of another component, the component can be "directly" located on the surface of another component, or a third component may be present between the two components. On the contrary, when it is described that a component is on the surface of another component, or a component is formed or provided on the surface of another component, it means that no third component is present between the two components. In addition, when it is described that a component is "substantially" formed on another component, it means that the component is not formed on the entire surface (or front surface) of another component, nor is it formed on a partial edge of the entire surface.

In the description of the embodiments of the present disclosure, when a component "includes" another component, unless otherwise stated, other components are not excluded and may be further included. In addition, when a component such as a layer, film, region, or plate is referred to as being "on/located on" another component, it can be "directly on" another component (i.e. located on the surface of another component with no other components between the two) or other components may be present therebetween. In addition, when a layer, film, region, or plate is "directly on" another component, or when a layer, film, region, or plate is located on the surface of another component, it means that no other components are located therebetween.

The terms used in the description of the various described embodiments herein is for describing particular embodiments only and are not intended to limit. As used in the description of the various embodiments described and the appended claims, "the component" is also intended to include the plural forms, unless the context clearly indicates otherwise. The component includes a layer, a film, a region, or a plate.

The various embodiments of the present disclosure will be described in detail below with reference to the accompanying drawings. However, it should be understood by those of ordinary skill in the art that, in each embodiment of the present disclosure, many technical details are provided in order to enable readers to better understand the embodiments of the present disclosure. However, even without these technical details and various changes and modifications based on the following embodiments, the technical solutions claimed in the embodiments of the present disclosure can be implemented.

A photovoltaic cell is provided according to an embodiment of the present disclosure, which will be described in detail below with reference to the accompanying drawings.

Referring to FIG. 1, which is a first partial cross-sectional view of a photovoltaic cell according to an embodiment of the present disclosure. The photovoltaic cell includes: a substrate 100 having a first surface 110; a passivation layer 101 located on the first surface 110, the passivation layer 101 has a groove 111 exposing the first surface 110, and the passivation layer 101 has a sidewall 101*a* forming the groove 111; and a grid line 102 extending along a first direction X, the grid line 102 is at least partially located in the groove 111 and is in ohmic contact with a part of the first surface 110 exposed by the groove 111, and a gap 103 is formed between the grid line 102 at least partially located in the groove 111 and the sidewall 101*a* along the first direction X. A material of the grid line 102 includes a low-fire-through conductive material.

It should be noted that the low-fire-through conductive material has very weak or even no corrosion and fire-through performance on the passivation layer 101 and the substrate 100. Therefore, under normal temperature and pressure, even if the grid line 102 including the low-fire-through conductive material is in direct contact with the substrate 100, it will not cause large damage to the substrate 100. Furthermore, compared with the commercially available high-fire-through conductive material, the low-fire-through conductive material has lower cost. The commercially available high-fire-through conductive material and the low-fire-through conductive material according to an embodiment of the present disclosure will be exemplified later and will not be described in detail here.

Based on this, the groove 111 is designed in the passivation layer 101 to expose the first surface 110 of the substrate 100, and the size of the groove 111 is designed to be greater than the size of the part of the grid line 102 located in the groove 111, that is, the gap 103 is formed between the part of the grid line 102 located in the groove 111 and the side wall 101*a* forming the groove 111 on the passivation layer 101. In other words, not only the passivation layer 101 and the grid line 102 are located on the first surface 110, but also the gap 103 exposing a part of the first surface 110 is formed between the passivation layer 101 and the part of the grid line 102 located in the groove 111. In this way, along the first direction X, the entire width of the grid line 102 can be in ohmic contact with the first surface 110, which is beneficial to ensure sufficient ohmic contact area between the grid line 102 and the first surface 110 by virtue of the groove 111 with a greater size. Furthermore, based on the size design of the groove 111 and the grid line 102, the entire width of the grid line 102 along the first direction X can be in ohmic contact with the first surface 110, and there is no need to increase the volume of the grid line 102 (for example, divide the grid line into two parts with different widths in the first direction) to improve the conductivity of the grid line 102, which is beneficial to ensure good conductivity between the grid line 102 and the first surface 110 while further reducing the preparation cost of the grid line 102 by reducing the volume of the grid line 102.

Furthermore, based on the fact that the low-fire-through conductive material has very weak corrosion and fire-through performance, on the basis of satisfying the performance of the passivation layer 101, the thickness of the passivation layer 101 can be thinned along a direction Z pointing from the substrate 100 to the grid line 102, which is beneficial to reduce the preparation cost of the passivation layer 101, so as to further reduce the preparation cost of the photovoltaic cell. Moreover, the thinning of the passivation layer 101 is also beneficial to reduce the parasitic absorption of light by the passivation layer 101, thus enabling more light energy to be absorbed by the substrate 100, thereby further improving the photoelectric conversion efficiency of the photovoltaic cell.

In some embodiments, compared to the case where no grooves are formed in the passivation layer and the material of the grid line is selected as the high-fire-through conductive material, the photovoltaic cell provided according to an embodiment of the present disclosure is beneficial to reduce the preparation cost of the grid line 102 by about 30%, improve the photoelectric conversion efficiency Eta by about 0.07%, improve the open-circuit voltage Uoc by about 0.001%, improve the short-circuit current by about 0.01%, improve the fill factor FF by about 0.1%, and improve the parallel resistance by about 32.49%.

The embodiments of the present disclosure will be described in more detail below with reference to the accompanying drawings.

In some embodiments, the low-fire-through conductive material can include copper and silver, a content of copper in the low-fire-through conductive material is a first content, a content of silver in the low-fire-through conductive material is a second content, and a ratio of the first content to the second content is in a range from 1 to 9. In this way, the content of copper in the low-fire-through conductive material is at least half.

It should be noted that the high-fire-through conductive material may be a conductive paste including only silver for the metallic material, or a conductive paste including only copper for the metallic material. The cost of conductive paste including only silver for the metallic material is relatively high, which is not conducive to reduce the preparation cost of the photovoltaic cell. For conductive paste including only copper for the metallic material, it is not easy to control the fire-through degree on the passivation layer and the substrate, which can be prone to cause large etching damage to the passivation layer or the substrate, thereby is prone to result in a decrease in the photoelectric conversion efficiency of the photovoltaic cell. Accordingly, the low-fire-through conductive material including copper and silver is designed to replace the common high-fire-through conductive material on the market, which is not only beneficial to reduce the preparation cost of the photovoltaic cell, but also forms a good ohmic contact between the grid line 102 and the first surface 110 by virtue of the weak corrosion and fire-through performance of the low-fire-through conductive material, thus avoiding further corrosion of the first surface 110 by the low-fire-through conductive material, thereby further improving the photoelectric conversion efficiency of the photovoltaic cell. It is also beneficial to thin the thickness of the passivation layer 101, which further reduces the preparation cost of the photovoltaic cell, and further improves the photoelectric conversion efficiency of the photovoltaic cell.

In some examples, the first content can be in a range of 50% to 90%. For example, the first content can be 52%, 55%, 58%, 60%, 64%, 65%, 68%, 70%, 72%, 75%, 78%, 80%, 83%, 85%, or 88%, etc.

In some embodiments, the substrate 100 has a front side and a back side that are opposed. In some cases, the photovoltaic cell is a single-sided cell, the front side of the substrate can be used as a light-receiving surface for receiving incident light, and the back side can be used as a backlighting surface. In other cases, the solar cell is a double-sided cell, both the front side and the back side of the substrate can be used as light-receiving surfaces for receiving incident light, the front side is the primary light-receiving surface and the back side is the secondary light-receiving surface. It should be note that the backlighting surface referred in the embodiments of the present disclosure can also receive incident light, but a degree of receiving the incident light is weaker than that of the light receiving surface, and therefore it is defined as the backlighting surface.

Figure 2:
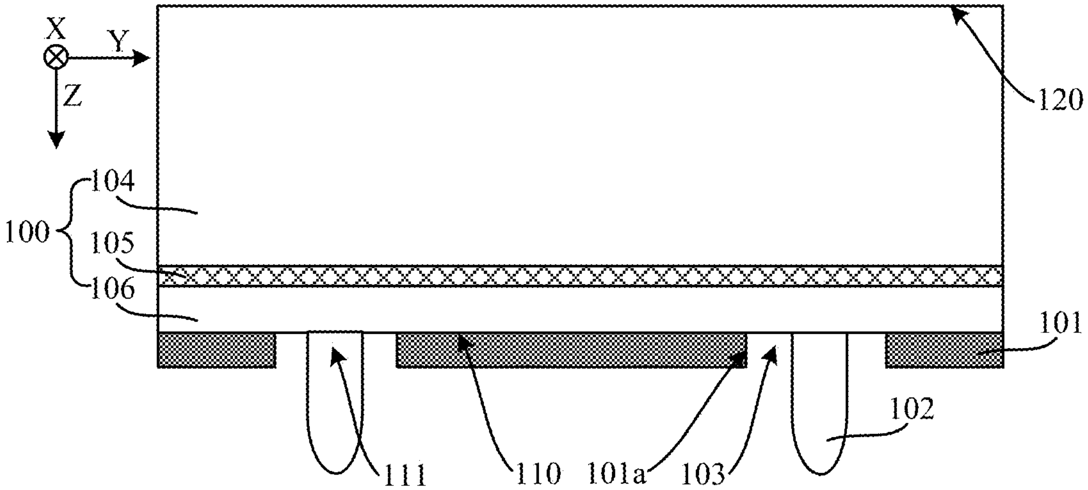
FIG. 2 is a second partial cross-sectional view of a photovoltaic cell according to an embodiment of the present disclosure.

In some examples, referring to FIG. 2, which is a second partial cross-sectional view of a photovoltaic cell according to an embodiment of the present disclosure. The first surface 110 can be the back side, the substrate 100 can include a base 104, a tunneling layer 105, and a doped conductive layer 106 that are sequentially stacked, and the first surface 110 is a surface of the doped conductive layer 106 away from the tunneling layer 105. The tunneling layer 105 and the doped conductive layer 106 form a passivation contact structure, which provides good surface passivation for the surface of the substrate 104, and is beneficial to reduce the metal contact composite current and improve the open-circuit voltage and short-circuit current of the photovoltaic cell. In other words, the photovoltaic cell can be a TOPCON (Tunnel Oxide Passivated Contact) cell.

Figure 3:
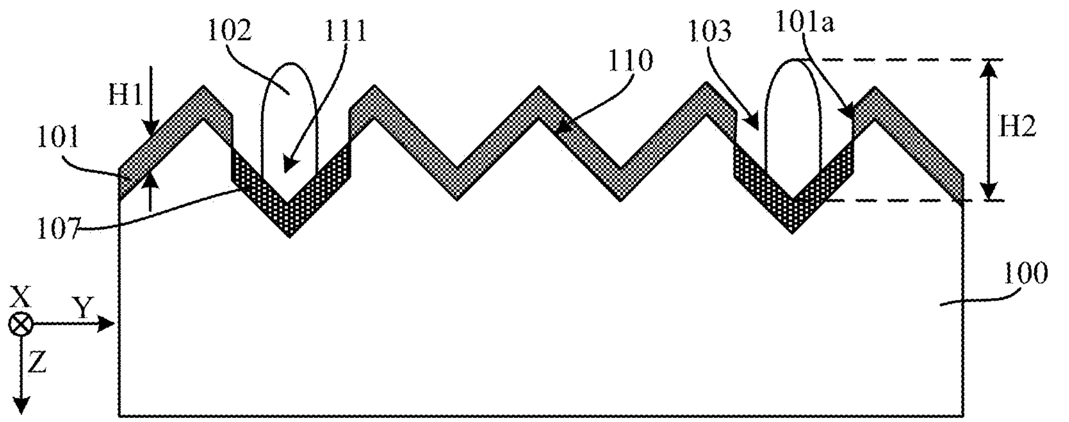
FIG. 3 is a third partial cross-sectional view of a photovoltaic cell according to an embodiment of the present disclosure.

In other examples, referring to FIG. 3, which is a third partial cross-sectional view of a photovoltaic cell according to an embodiment of the present disclosure. The first surface 110 can be the front side, the substrate 100 includes an emitter 107, and the first surface 110 includes a surface of the emitter 107. It should be noted that the emitter 107 can be formed based on the substrate 100, thus the emitter 107 is embedded in the substrate 100. The emitter 107 is exemplified in FIG. 3 as being embedded in the substrate 100 and the emitter 107 is a selective emitter directly opposite to the grid line 102, but in practical applications, the emitter can be embedded in the entire first surface of the substrate, or the substrate includes the base or the emitter, and the emitter is additionally formed on the surface of the base.

Figure 4:
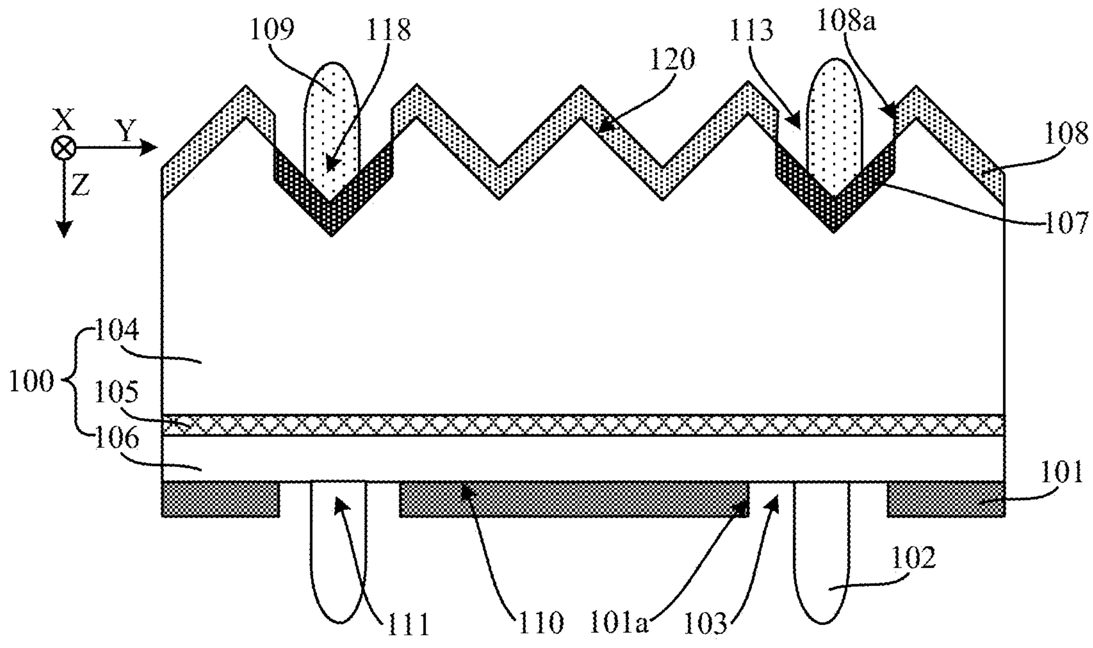
FIG. 4 is a fourth partial cross-sectional view of a photovoltaic cell according to an embodiment of the present disclosure.

In some other examples, referring to FIG. 4, which is a fourth partial cross-sectional view of a photovoltaic cell according to an embodiment of the present disclosure. The first surface 110 can be the back side, the passivation layer 101 located on the first surface 110 can be regarded as a back passivation layer, the groove 111 of the passivation layer 101 can be regarded as a back groove, the grid line 102 in ohmic contact with the first surface 110 can be regarded as a back grid line, the side wall 101*a* of the passivation layer 101 can be regarded as a back side wall, and the gap 103 between the grid line 102 and the side wall 101*a* can be regarded as a back gap.

On this basis, the front side of the substrate 100 can be regarded as a second surface 120, and the photovoltaic cell can further include: a front passivation layer 108 located on the second surface 120. The front passivation layer 108 has a front groove 118 exposing the second surface 120, and the front passivation layer 108 has a front sidewall 108*a* forming the front groove 118; and a front grid line 109, the front grid line 109 is at least partially located in the front groove 118 and is in ohmic contact with a part of the second surface 120 exposed by the front groove 118, and a front gap 113 is formed between the front grid line 109 at least partially located in the front groove 118 and the front sidewall 108*a* along the first direction X. A material of the front grid line 109 includes the low-fire-through conductive material.

It should be noted that in order to distinguish the grid line 102 from the front grid line 109, different filling methods are used to draw the grid line 102 and the front grid line 109 in FIG. 4. In order to distinguish the passivation layer 101 from the front passivation layer 108, different filling methods are used to draw the passivation layer 101 and the front passivation layer 108 in FIG. 4.

It should be noted that in practical applications, the first surface can also be the front side, and the back side of the substrate can be regarded as the second surface, which also has a passivation layer and a grid line similar to those in the foregoing examples. In addition, in the aforementioned examples, either the grid line 102 or the front grid line 109 can be a busbar, a finger, or a busbar and a finger. The grid line that needs to be designed to include the low-fire-through conductive material in the photovoltaic cell can be selected according to actual needs. A groove can be designed for the passivation layer opposite to the grid line, so as to specifically reduce the preparation cost of the grid line and improve the photoelectric conversion efficiency of the photovoltaic cell. In addition, for a certain grid line 102, based on the type of grid line referred to by the grid line 102, the extension direction of the grid line 102, that is, the first direction X, changes with the change of the type of the grid line. For example, the extension direction of the grid line 102 serving as the busbar is different from the extension direction of the grid line 102 serving as a finger. In practical applications, the first direction can be flexibly adapted according to the specific application scenario of the grid line described in an embodiment of the present disclosure.

Figure 5:
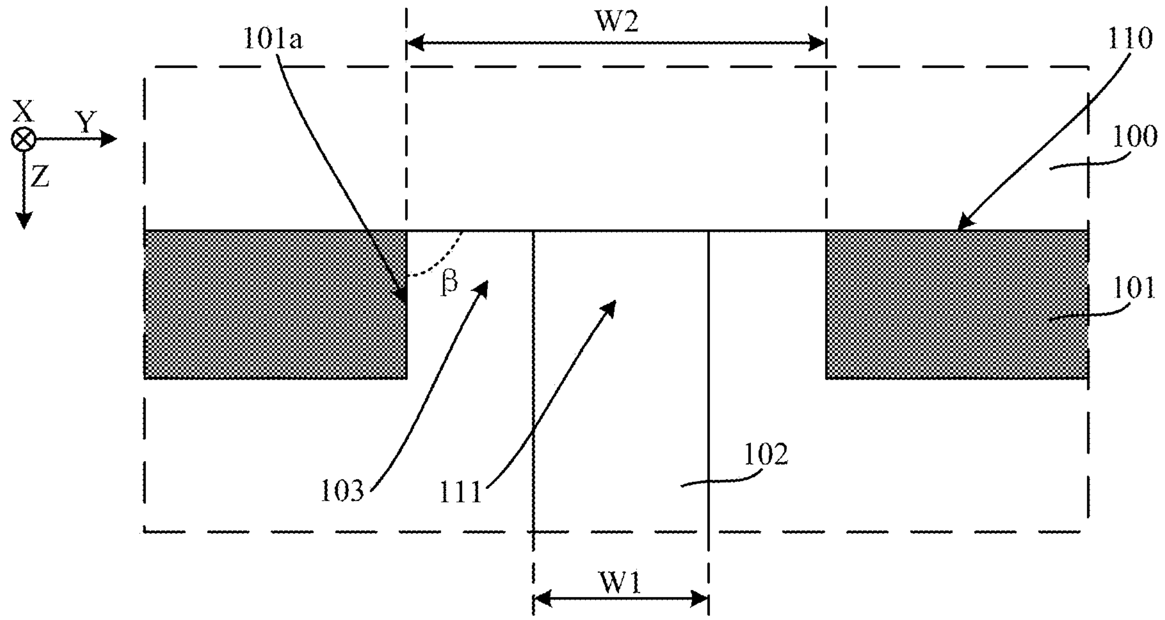
FIG. 5 is an enlarged cross-sectional view of the dashed box area of the photovoltaic cell shown in FIG. 1.

In some embodiments, referring to FIG. 5, which is an enlarged cross-sectional view of the dashed box area of the photovoltaic cell shown in FIG. 1. Taking a plane where the first surface 110 is located as a reference plane, an angle $\beta$ between the side wall 101*a* and the reference plane is 45° to 150°.

It should be noted that compared with the depression formed in the passivation layer by high-temperature sintering of the high-fire-through conductive material, the sidewall 101*a* forming the groove 111 in the passivation layer 101 is flatter, and the angle $\beta$ between the sidewall 101*a* and the reference plane can be clearly observed. In other words, the side wall 101*a* is a relatively flat surface, which is different from the relatively rough interface where the high-fire-through conductive material contacts the passivation layer after high-temperature sintering. It should be understood that different areas of the interface where the high-fire-through conductive material is in contact with the passivation layer after high-temperature sintering are corroded to different degrees by the high-fire-through conductive material, resulting in great differences in different areas of the interface where the high-fire-through conductive material contacts the passivation layer.

In some examples, the angle β can be 90° to 150°. For example, the angle β can be 95°, 100°, 105°, 110°, 115°, 120°, 125°, 130°, 135°, 140°, or 145°.

In some embodiments, referring to FIGS. 1 to 5, a surface roughness of the sidewall 101*a* is less than or equal to 6.3 μm. In other words, the side wall 101*a* is a relatively flat surface.

In some embodiments, referring to FIGS. 1 to 5, the gap 103 is formed between any grid line 102 located in the groove 111 and the sidewall 101*a*. In this way, it is beneficial to reduce a width of the grid line 102 in a second direction Y while ensuring sufficient ohmic contact area between the grid line 102 and the first surface 110, so as to further reduce the preparation cost of the grid line 102.

In some embodiments, referring to FIGS. 1 to 5, a contact resistivity between the grid line 102 and the first surface 110 is less than 5 mΩ·cm$^2$. In other words, based on the design of the groove 111 in the passivation layer 101, the grid line 102 including the low-fire-through conductive material does not need to have strong fire-through performance and can also have a low contact resistivity with the first surface 110, that is, achieve good ohmic contact with the first surface 110. In some examples, the grid line 102 including the low-fire-through conductive material can be a grid line formed by laser-enhanced contact optimization of the low-fire-through conductive material.

Figure 6:
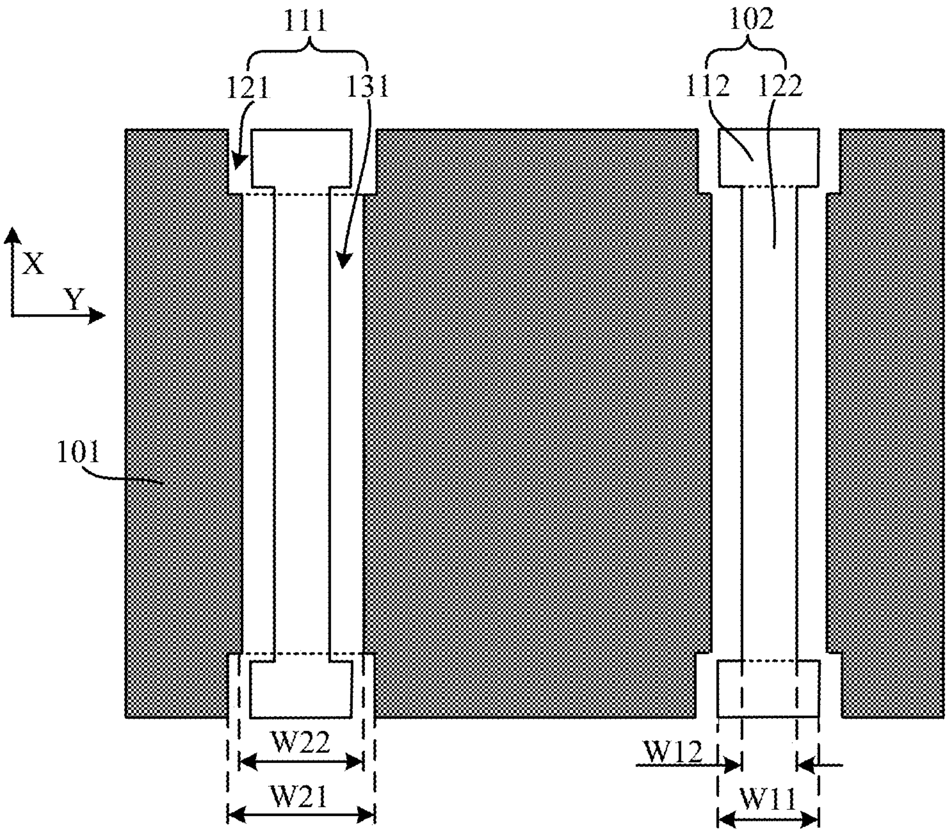
FIG. 6 is a first partial top view of a photovoltaic cell according to an embodiment of the present disclosure.

In some embodiments, referring to FIGS. 1 to 7, the grid line 102 is at least partially located in the groove 111 and is in ohmic contact with the first surface 110 exposed by the groove 111, including the following cases:

In some cases, with reference to FIGS. 5 and 6 (FIG. 6 is a first partial top view of a photovoltaic cell according to an embodiment of the present disclosure), one grid line 102 is located in one groove 111, the groove 111 extends along the first direction X and penetrates the passivation layer 101 along the first direction X, and the passivation layer 101 has two side walls 101*a* forming the groove 111 that are opposite to each other in the second direction Y. Based on this, the entire grid line 102 is located in the groove 111. In other words, an orthographic projection of the entire grid line 102 on the substrate 100 is located in an orthographic projection of the groove 111 corresponding to the grid line 102 on the substrate 100. In this way, a bottom surface of the entire grid line 102 adjacent to the substrate 100 is in ohmic contact with the first surface 110.

Figure 7:
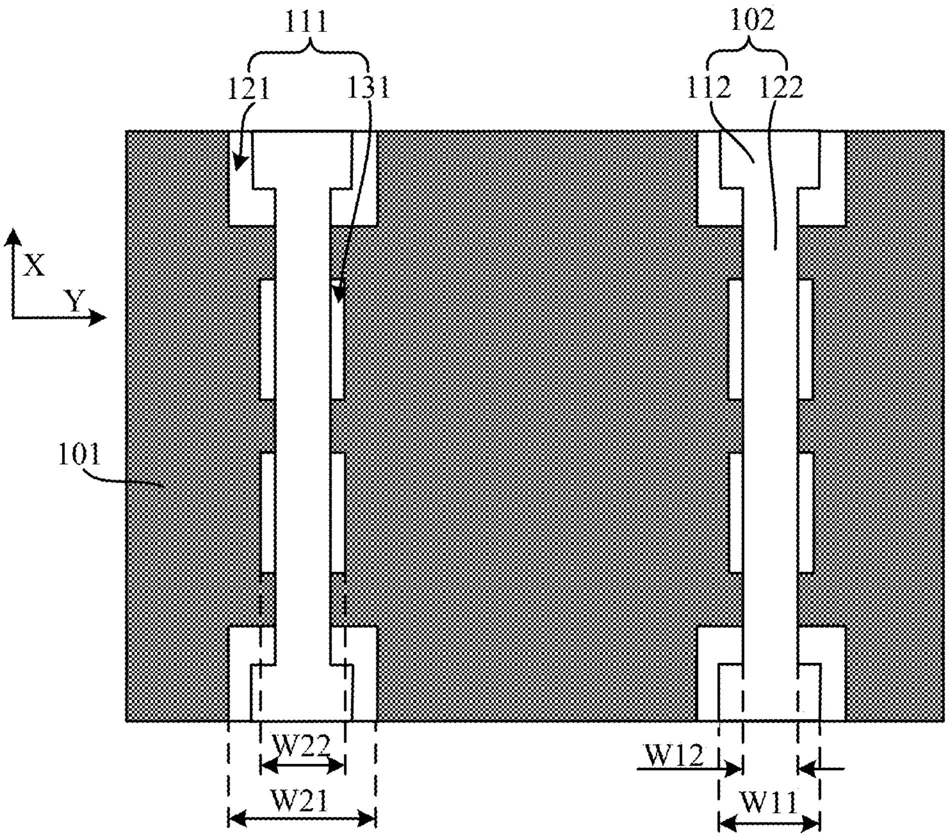
FIG. 7 is a second partial top view of a photovoltaic cell according to an embodiment of the present disclosure.

In other cases, with reference to FIGS. 5 and 7 (FIG. 7 is a second partial top view of a photovoltaic cell according to an embodiment of the present disclosure), one grid line 102 is located in a plurality of grooves 111 spaced apart along the first direction X, and the passivation layer 101 has three or four side walls 101*a* forming the grooves 111. Based on this, only a part of the grid line 102 is located in the groove 111, and a part of the grid line 102 is located on the surface of the passivation layer 101 between adjacent grooves 111 along the first direction X. In this way, a bottom portion of the entire grid line 102 adjacent to the substrate 100 is in ohmic contact with the first surface 110, and the other portion is in contact connection with the surface of the passivation layer 101 away from the substrate 100.

It should be noted that in the aforementioned two cases, the grid line 102 can be in ohmic contact with the first surface 110 by virtue of the groove 111, which is beneficial for sufficient contact between the grid line 102 and the first surface 110 exposed by the groove 111, ensuring sufficient ohmic contact area between the grid line 102 and the first surface 110, so as to improve the conductivity between the grid line 102 and the first surface 110, and ensure that the grid line 102 has a higher photogenerated carrier collection ability. In addition, along the first direction X, the larger the length of the part of the grid line 102 that achieves ohmic contact with the groove 111 in the entire length of the grid line 102 is, the more beneficial it is to increase the ohmic contact area between the grid line 102 and the first surface 110. Furthermore, on the premise of ensuring sufficient ohmic contact area between the grid line 102 and the first surface 110, it is beneficial to reduce the width of the grid line 102 in the second direction Y, so as to reduce the volume of the grid line 102, thus is beneficial to further reduce the preparation cost of the grid line 102.

In some embodiments, the first surface 110 can be divided into three parts, in which a first part is an area covered with the passivation layer 101, a second part is a part exposed by the gap 103, and a third part is a part covered with the grid line 102. An area of the first part is greater than an area of the second part, and the area of the second part is greater than an area of the third part. It should be noted that an area occupied by the groove 111 on the passivation layer 101 on the first surface 110 is the sum of the areas of the second part and the third part. In this way, it is beneficial to ensure a great difference between an area occupied by the groove 111 on the first surface 110 and an area occupied by the grid line 102 on the first surface 110, so as to ensure that the grid line 102 directly opposite to the groove 111 can be completely located in the groove 111, and is not susceptible to the manufacturing process error to be in contact with the side wall 101*a*. It is also beneficial to reduce the width of the grid line 102 in the second direction Y on the premise of ensuring sufficient ohmic contact area between the grid line 102 and the first surface 110, so as to further reduce the preparation cost of the grid line 102.

In some embodiments, with reference to FIGS. 1 to 7, along the second direction Y perpendicular to the first direction X, a first width W1 of the grid line 102 is less than a second width W2 of the groove 111.

It should be noted that when the first width is less than the second width W2, it can ensure that the part of the grid line 102 directly opposite to the groove 111 is located in the groove 111, so as to ensure sufficient ohmic contact area between the grid line 102 and the first surface 110. On the premise of ensuring sufficient ohmic contact area between the grid line 102 and the first surface 110, the width of the grid line 102 in the second direction Y is reduced to further reduce the preparation cost of the grid line 102.

In some cases, with reference to FIGS. 5 to 7, for any grid line 102, the first width W1 of different areas of the grid line 102 along the first direction X may be the same or different. Furthermore, for any grid line 102, the grid line 102 is located in at least one groove 111. In some cases, with reference FIGS. 5 and 6, one grid line 102 is located in one groove 111, the groove 111 extends along the first direction X and penetrates the passivation layer 101 along the first direction X. In other cases, with reference FIGS. 5 and 7, one grid line 102 is located in a plurality of grooves 111, and the plurality of grooves 111 are spaced apart along the first direction X. Not only the second width W2 of different areas of the groove 111 along the first direction X may be the same or different, but the second width W2 of different grooves 111 may also be the same or different.

Based on this, when it is referred to that along the second direction Y, the first width W1 of the grid line 102 is less than the second width W2 of the groove 111, it means that: along the first direction X, in a plurality of cross-sections parallel to the second direction Y, for the grid line 102 and the groove 111 on any cross-section, the first width W1 of the grid line 102 is less than the second width W2 of the groove 111 where the grid line 102 is located. Therefore, an average of the first width W1 of the grid line 102 is also less than an average of the second width W2 of the groove 111.

In some examples, a ratio of the second width W2 to the first width W1 is greater than 1 and less than or equal to 60. For example, the ratio of the second width W2 to the first width W1 can be greater than 1 and less than or equal to 10. Alternatively, the ratio of the second width W2 to the first width W1 can range from 10 to 15, 15 to 20, 20 to 25, 25 to 30, 30 to 35, 35 to 40, 40 to 45, 45 to 50, 50 to 55, or 55 to 60, etc.

In some examples, the first width W1 of the grid line 102 can be 5 μm to 100 μm. For example, the first width W1 can be 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, or 95 μm, etc.

In some examples, the second width W2 of the groove 111 can be 10 μm to 300 μm. For example, the second width W2 can be 20 μm, 30 μm, 40 μm, 50 μm, 60 μm, 70 μm, 80 μm, 90 μm, 100 μm, 110 μm, 120 μm, 130 μm, 140 μm, 150 μm, 160 μm, 170 μm, 180 μm, 190 μm, 200 μm, 210 μm, 220 μm, 230 μm, 240 μm, 250 μm, 260 μm, 270 μm, 280 μm, or 290 μm, etc.

In some embodiments, referring to FIG. 6 or 7, the grid line 102 extends along the first direction X, and the grid line 102 has two end portions 112 and a middle portion 122 connecting the two end portions 112 along the first direction X. In a direction Z along which the substrate 100 points to the grid line 102, an area of the groove 111 corresponding to the end portion 112 is a first sub-groove 121, and an area of the groove 111 corresponding to the middle portion 122 is a second sub-groove 131. It should be noted that the end portion 112 and the middle portion 122 of the grid line 102 are divided by dashed lines in FIGS. 6 and 7, and the first sub-groove 121 and the second sub-groove 131 of the groove 111 are also divided by dashed lines in FIG. 6.

The size relationship between the end portion 112 and the first sub-groove 121, and the size relationship between the middle portion 122 and the second sub-groove 131 are described in detail below.

In some cases, referring to FIG. 6, along the second direction Y perpendicular to the first direction X, a first sub-width W11 of the end portion 112 is greater than a second sub-width W12 of the middle portion 122. In practical applications, the first sub-width of the end portion can also be equal to the second sub-width of the middle portion. In other words, the grid line is not specifically divided into an end portion and a middle portion.

It should be noted that the photovoltaic cell has a central area and a peripheral area surrounding the central area. Generally, the peripheral area is subject to greater external pressure and is more prone to damage such as hidden cracks due to excessive force. Based on this, the grid line 102 is designed to have the end portion 112 and the middle portion 122. The end portion 112 is located in the peripheral area, and the middle portion 122 is located in the central area. When the first sub-width W11 of the end portion 112 is greater than or equal to the second sub-width W12 of the middle portion 122, it is beneficial to reduce the probability of the end portion 112 being broken due to excessive force, and is beneficial to improve the overall structural stability of the grid line 102, and further improve the overall conductive performance of the grid line 102 by virtue of the end portion 112 with the greater first sub-width W11.

It should be noted that, with reference FIGS. 5 and 6, the end portion 112 and the middle portion 122 are different areas of the grid line 102 along the first direction X, the first sub-width W11 of the end portion 112 is the first width W1 of an area of the grid line 102 along the first direction X, and the second sub-width W12 of the middle portion 122 is the first width W1 of another area of the grid line 102 along the first direction X.

In some examples, with reference to FIGS. 5 and 6, on the basis that the first sub-width W11 of the end portion 112 is greater than the second sub-width W12 of the middle portion 122, the groove 111 extends along the first direction X and penetrates the passivation layer 101 along the first direction X. A third sub-width W21 of the first sub-groove 121 is the second width W2 of an area of the groove 111 along the first direction X, and a fourth sub-width W22 of the second sub-groove 131 is the second width W2 of another area of the groove 111 along the first direction X.

In other examples, with reference to FIGS. 5 and 7, on the basis that the first sub-width W11 of the end portion 112 is greater than the second sub-width W12 of the middle portion 122, a plurality of grooves 111 are spaced apart along the first direction X. The third sub-width W21 of the first sub-groove 121 is the second width W2 of a groove 111 corresponding to the end portion 112 among the plurality of grooves 111 spaced apart along the first direction X. The fourth sub-width W22 of the second sub-groove 131 is the second width W2 of another groove 111 corresponding to the middle portion 122 among the plurality of grooves 111 spaced apart along the first direction X.

In the aforementioned two examples, the third sub-width W21 of the first sub-groove 121 is designed to be greater than or equal to the fourth sub-width W22 of the second sub-groove 131, which corresponds to that the first sub-width W11 of the grid line 102 is greater than or equal to the second sub-width W12 of the middle portion 122, so as to further ensure that the grid line 102 is located in the groove 111 and the gap 103 is formed between the grid line 102 and the side wall 101*a*. Furthermore, as the first width W1 of the grid line 102 increases, the second width W2 of the groove 111 corresponding to the area of the grid line 102 is also increased accordingly, which is also beneficial to further increase the ohmic contact area between the grid line 102 and the substrate 100. In addition, the third sub-width W21 of the first sub-groove 121 is exemplified in FIG. 6 and FIG. 7 as being greater than the fourth sub-width W22 of the second sub-groove 131, but in practical applications, the third sub-width of the first sub-groove can also be equal to the fourth sub-width of the second sub-groove.

It should be noted that in practical applications, on the premise that the first width of the grid line is less than the second width of the groove along the second direction, when the first sub-width of the end portion is greater than the second sub-width of the middle portion, the third sub-width of the first sub-groove can be greater than or equal to the fourth sub-width of the second sub-groove; when the first sub-width of the end portion is equal to the second sub-width of the middle portion, the third sub-width of the first sub-groove can also be greater than or equal to the fourth sub-width of the second sub-groove.

Figure 8:
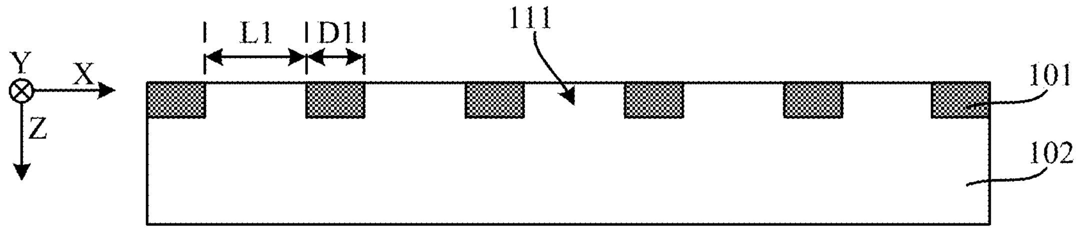
FIG. 8 is a first partial cross-sectional view of a grid line and a passivation layer of a photovoltaic cell according to an embodiment of the present disclosure.
Figure 9:
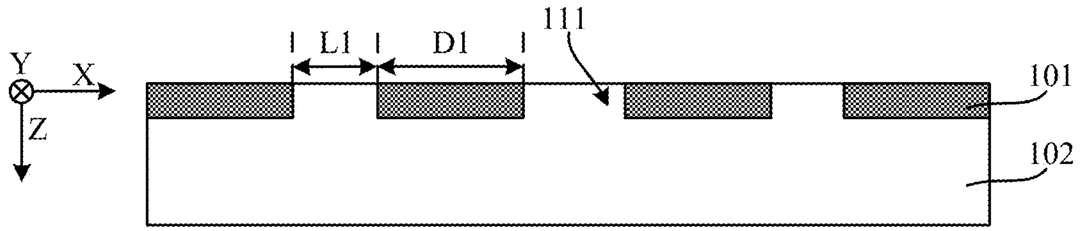
FIG. 9 is a second partial cross-sectional view of a grid line and a passivation layer of a photovoltaic cell according to an embodiment of the present disclosure.

In some embodiments, referring to FIG. 8 or FIG. 9, the passivation layer 101 has a plurality of grooves 111 spaced apart along the first direction X, and the grid line 102 is located in the plurality of grooves 111. A first spacing D1 is formed between adjacent two grooves 111 along the first direction X, and a ratio of a first length L1 of the groove 111 in the first direction X to the first spacing D1 ranges from 1/40 to 10/1.

FIG. 8 is a first partial cross-sectional view of a grid line and a passivation layer of a photovoltaic cell according to an embodiment of the present disclosure, and FIG. 9 is a second partial cross-sectional view of a grid line and a passivation layer of a photovoltaic cell according to an embodiment of the present disclosure.

If the ratio of the first length L1 of the groove 111 to the first spacing D1 is less than 1/40, the part of the passivation layer 101 in contact with the grid line 102 that has the groove 111 is too small. In other words, the part of the entire grid line 102 that can be in ohmic contact with the first surface 110 by virtue of the groove 111 is too small, which is not conducive to increase the ohmic contact area between the entire grid line 102 and the first surface 110. If the ratio of the first length L1 of the groove 111 to the first spacing D1 is greater than 10/1, the part of the passivation layer 101 in contact with the grid line 102 that has the groove 111 is too large, and the size of the part of the passivation layer 101 located between adjacent grooves 111 is relatively small, which is prone to collapse due to force, affecting the ohmic contact between the grid line 102 and the first surface 110. Therefore, the ratio of the first length L1 of the groove 111 to the first spacing D1 is designed to be ranging from 1/40 to 10/1, which is beneficial to ensure a high structural stability of the passivation layer 101 itself while enabling an appropriate part of the passivation layer 101 that has the groove 111 to be in contact with the grid line 102, so as to ensure sufficient ohmic contact area between the grid line 102 and the first surface 110 by virtue of the groove 111, thereby improving the conductivity between the grid line 102 and the first surface 110.

It should be noted that based on different preparation methods of the groove 111 of the passivation layer 101, the ratio of the first length L1 of the groove 111 to the first spacing D1 has the following two cases:

In some cases, referring to FIG. 8, the groove 111 of the passivation layer 101 is prepared by a continuous punctate film removing method, and the ratio of the first length L1 of the groove 111 in the first direction X to the first spacing D1 ranges from 1/5 to 10/1. For example, the ratio of the two can be 1/4, 1/3, 1/2, 1, 2, 3, 4, 5, 6, 7, 8, or 9, etc.

In other cases, referring to FIG. 9, the groove 111 of the passivation layer 101 is prepared by a continuous line segment film removing method, and the ratio of the first length L1 of the groove 111 in the first direction X to the first spacing D1 ranges from 1/40 to 5/1. For example, the ratio of the two can be 1/35, 1/30, 1/25, 1/20, 1/15, 1/10, 1/5, 1, 1.5, 2, 2.5, 3, 3.5, 4, or 4.5, etc.

In some other embodiments, referring to FIG. 6, the grid line 102 extends along the first direction X, the passivation layer 101 has the groove 111 extending also along the first direction X and penetrating the passivation layer 101 along the first direction X, and the grid line 102 and the groove 111 are in one-to-one correspondence. It should be noted that in some cases, the grid line including the low-fire-through conductive material is a finger, and a material of a busbar that collects the current on the finger is different from a material of the finger. For example, the material of the busbar includes the high-fire-through conductive material. When the groove penetrates the passivation layer along the first direction, the part of the busbar that is in contact connection with the finger may also be located in the groove.

It should be noted that in order to ensure sufficient ohmic contact area between the grid line and the first surface exposed by the groove, in practical applications, the ratio of the first width of the grid line to the second width of the groove can also be designed to be different according to the selected type of the groove corresponding to one grid line. For example, if a plurality of grooves corresponds to one grid line, and the part of the passivation layer in contact with the grid line that has the grooves is relatively small, the ratio of the first width of the grid line to the second width of the groove can be designed to be relatively large, that is, a difference between the first width and the second width is relatively small, so as to increase the area of the first surface exposed by the groove. If the groove in contact connection with one grid line is the groove that penetrates the passivation layer along the first direction, the ratio of the first width of the grid line to the second width of the groove can be designed to be relatively small, that is, the difference between the first width and the second width is relatively large.

Figure 10:
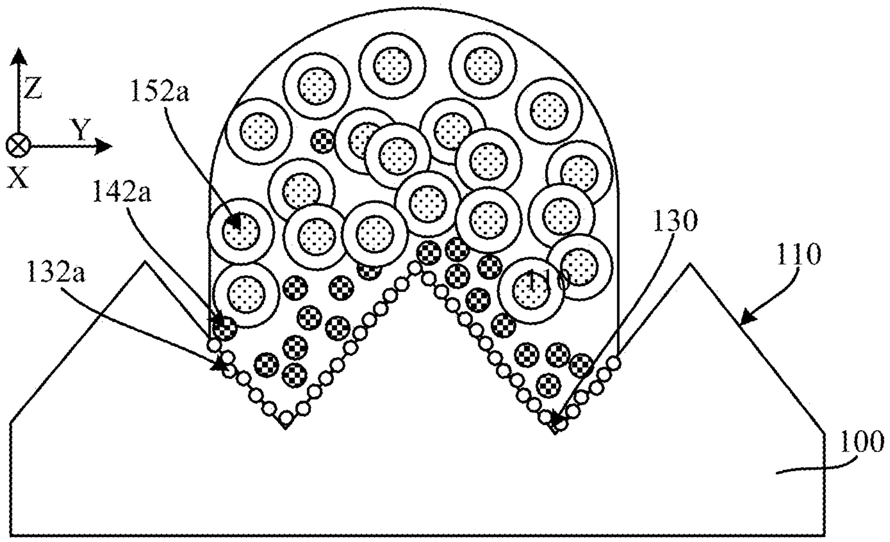
FIG. 10 is a partial enlarged cross-sectional view of a grid line and a substrate of a photovoltaic cell according to an embodiment of the present disclosure.

In some embodiments, referring to FIG. 10, which is a partial enlarged cross-sectional view of a grid line and a substrate of a photovoltaic cell according to an embodiment of the present disclosure, an ohmic contact interface 130 is formed between the grid line 102 and the first surface 110, and the grid line 102 includes silver crystallites 132*a* in contact connection with the ohmic contact interface 130. The ohmic contact interface 130 includes a first area in contact connection with the silver crystallites 132*a*, and a ratio of the first area to an area of the ohmic contact interface 130 ranges from 60% to 90%.

It should be noted that most of the area forming the ohmic contact interface 130 in the grid line 102 is the first area, and the first area is composed of silver crystallites 132*a*. A plurality of silver crystallites 132*a* can form a thin layer for carrier transmission at the ohmic contact interface 130. The thin layer is in ohmic contact with the first surface 110 of the substrate 100, which is beneficial to reduce the contact resistivity between the grid line 102 and the first surface 110, facilitating the formation of good ohmic contact between the grid line 102 and the first surface 110, and enhancing the ability of the carriers in the substrate 100 to be transmitted to the grid line 102 that penetrates the passivation layer 101, thereby improving the collection efficiency of the grid line 102 for photogenerated carriers. Furthermore, the larger the proportion of the first area in the ohmic contact interface 130 is, the more beneficial it is to reduce the contact resistivity between the grid line 102 and the first surface 110. In addition, an area of the ohmic contact interface 130 other than the first area can include a small amount of silver particles or silver-coated copper particles.

In some examples, the ratio of the first area to the area of the ohmic contact interface 130 can be 65%, 68%, 70%, 72%, 75%, 80%, 84%, 85%, or 88%, etc.

Figure 11:
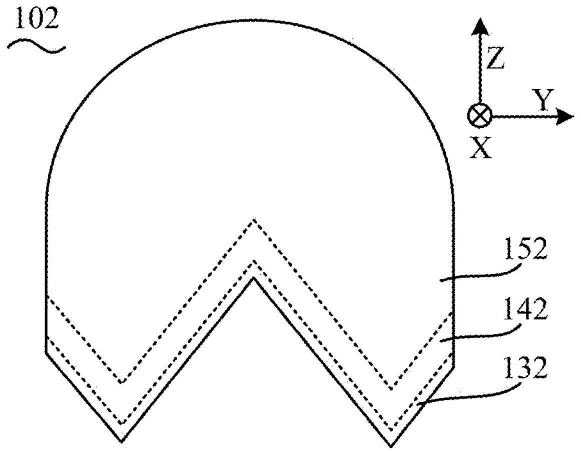
FIG. 11 is a cross-sectional view of a grid line of the photovoltaic cell shown in FIG. 10.

In some embodiments, with reference to FIGS. 10 and 11, in which FIG. 11 is a cross-sectional view of a grid line of the photovoltaic cell shown in FIG. 10, the grid line 102 includes a bottom portion 132, a transition portion 142, and a top portion 152 that are sequentially connected in the direction Z along which the substrate 100 points to the grid line 102. The bottom portion 132 is in ohmic contact with the first surface 110 and includes silver crystallites 132*a*, the transition portion 142 includes silver particles 142*a*, the top portion 152 includes silver-coated copper particles 152*a*, and a size of the silver crystallites 132*a* is less than a size of the silver particles 142*a*.

It should be noted that the bottom portion 132, the transition portion 142, and the top portion 152 of the grid line 102 are roughly divided by dashed lines in FIG. 11. In practical applications, substantial areas of the bottom portion 132, the transition portion 142, and the top portion 152 can be defined according to the specific distribution of the silver crystallites 132*a*, the silver particles 142*a*, and the silver-coated copper particles 152*a* in the grid line 102.

It should be noted that the main conductive component in the bottom portion 132 is the silver crystallites 132*a*, and a small amount of silver particles 142*a* and/or silver-coated copper particles 152*a* may also be doped. In other words, a content of the silver crystallites 132*a* in the bottom portion 132 is greater than a content of other components in the bottom portion 132. The main conductive component in the transition portion 142 is the silver particles 142*a*, and a small amount of silver crystallites 132*a* and/or silver-coated copper particles 152*a* may also be doped. In other words, a content of the silver particles 142*a* in the transition portion 142 is greater than a content of other components in the transition portion 142. The main conductive component in the top portion 152 is the silver-coated copper particles 152*a*, and a small amount of silver crystallites 132*a* and/or silver particles 142*a* may also be doped. In other words, a content of the silver-coated copper particles 152*a* in the top portion 152 is greater than a content of other components in the top portion 152.

The bottom portion 132 is the thin layer for carrier transmission formed by the plurality of silver crystallites 132*a* at the ohmic contact interface 130 as described above, and is mainly used to reduce the contact resistivity between the grid line 102 and the first surface 110. The transition portion 142 and the top portion 152 serve as a transmission layer for carriers in the grid line 102, and are mainly used to reduce the line resistance of the grid line 102, which is beneficial to further improve the transmission efficiency of carriers in the grid line 102.

In some cases, the silver crystallites 132*a*, the silver particles 142*a*, and the silver-coated copper particles 152*a* are all spherical particles, and the sizes of the silver crystallites 132*a*, the silver particles 142*a*, and the silver-coated copper particles 152*a* may all refer to diameters of the spherical particles.

In some examples, the size of the silver crystallites 132*a* is 5 nm to 20 nm, the size of the silver particles 142*a* is 20 nm to 100 nm, and a size of the silver-coated copper particles 152*a* is 1 μm to 10 μm.

In the aforementioned various embodiments, in addition to the silver crystallites 132*a*, the silver particles 142*a*, and the silver-coated copper particles 152*a*, the grid line 102 further includes a filler filled among the silver crystallites 132*a*, the silver particles 142*a*, and the silver-coated copper particles 152*a*. The filler mainly includes glass or resin, and is used to fill and adhere the silver crystallites 132*a*, the silver particles 142*a*, and the silver-coated copper particles 152*a*.

In some embodiments, referring to FIG. 1 or FIG. 3, in a direction along which the substrate 100 points to the grid line 102, a depth H1 of the groove 111 is 10 nm to 200 nm. It should be noted that the depth H1 of the groove 111 is a thickness of the passivation layer 101 in the direction Z. In other words, the thickness of the passivation layer 101 in the direction Z is 10 nm to 200 nm.

It should be noted that compared with the grid line prepared by the high-fire-through conductive material, which needs to be matched with a thicker passivation layer, so as to avoid further damage to the substrate after the grid line fires through the passivation layer. In an embodiment of the present disclosure, the design of the groove 111 on the passivation layer 101 is combined with the grid line 102 including the low-fire-through conductive material, which can not only adapt to the thicker passivation layer 101 that matches the high-fire-through conductive material, but also can reduce the thickness of the passivation layer 101. Furthermore, the thinning of the passivation layer 101 not only can reduce the preparation cost of the passivation layer 101, but is also beneficial to reduce the parasitic absorption of light by the passivation layer 101, enabling more light energy to be absorbed by the substrate 100, thereby further improving the photoelectric conversion efficiency of the photovoltaic cell. Therefore, the depth H1 of the groove 111, i.e. the thickness of the passivation layer 101 in the direction Z, can be designed to be as small as 10 nm or as large as 200 nm.

In some examples, the depth H1 of the groove 111 can be 70 nm to 100 nm. For example, H1 can be 75 nm, 80 nm, 85 nm, 88 nm, 90 nm, 95 nm, or 98 nm, etc.

In some embodiments, referring to FIG. 1 or FIG. 3, in a direction along which the substrate 100 points to the grid line 102, a height H2 of the grid line 102 is 5 μm to 13 μm.

It should be noted that the height H2 of the grid line 102 is much greater than the depth H1 of the groove 111. In other words, the height H2 of the grid line 102 is much greater than the thickness of the passivation layer 101. Even so, based on the characteristic that the grid line 102 includes the low-fire-through conductive material, the grid line 102 will not cause excessive erosion to the passivation layer 101 and the substrate 100, which is beneficial to ensuring a relatively thin thickness of the passivation layer 101 while not causing damage to the passivation layer 101 and the substrate 100, and not causing an adverse effect on the photoelectric conversion efficiency of the photovoltaic cell. Furthermore, the reduction of the thickness of the passivation layer 101, the design of the groove 111 on the passivation layer 101, and the design of the grid line 102 including the low-fire-through conductive material are not only beneficial to reduce the preparation cost of the photovoltaic cell, but also beneficial to improve the photoelectric conversion efficiency of the photovoltaic cell.

In some examples, the height H2 of the grid line 102 can be 8 μm to 10 μm. For example, H2 can be 8.2 μm, 8.5 μm, 8.8 μm, 9 μm, 9.3 μm, 9.5 μm, or 9.6 μm, etc.

It should be noted that a pyramid morphology of the first surface 110 is exemplified in FIGS. 3, 10, and 11, but in practical applications, the morphology of the first surface can be designed as required. In other words, the first surface can be in a pyramid morphology or a relatively flat non-pyramid morphology. In addition, a pyramidal morphology of the second surface 120 opposite to the first surface 110 along the direction Z is exemplified in FIG. 4, but in practical applications, the morphology of the second surface can be designed as required. In other words, the second surface can be a pyramidal morphology or a relatively flat non-pyramid morphology.

In conclusion, the groove 111 is designed in the passivation layer 101 to expose the first surface 110 of the substrate 100, and the gap 103 is formed between the part of the grid line 102 located in the groove 111 and the sidewall 101*a* forming the groove 111. In this way, the entire width of the grid line 102 along the first direction X can be in ohmic contact with the first surface 110, which is beneficial to ensure sufficient ohmic contact area between the grid line 102 and the first surface 110 by virtue of the groove 111 with a greater size. In addition, there is no need to increase the volume of the grid line 102 (for example, divide the grid line into two parts with different widths in the first direction) to improve the conductivity of the grid line 102, which is beneficial to ensure good conductivity between the grid line 102 and the first surface 110 while further reducing the preparation cost of the grid line 102 by reducing the volume of the grid line 102. Furthermore, based on the fact that the low-fire-through conductive material has very weak corrosion and fire-through performance, on the basis of meeting the performance of the passivation layer 101, the thickness of the passivation layer 101 can be thinned along a direction Z pointing from the substrate 100 to the grid line 102, which is beneficial to reduce the preparation cost of the passivation layer 101, so as to further reduce the preparation cost of the photovoltaic cell. Moreover, the thinning of the passivation layer 101 is also beneficial to reduce the parasitic absorption of light by the passivation layer 101, enabling more light energy to be absorbed by the substrate 100, thereby further improving the photoelectric conversion efficiency of the photovoltaic cell.

A preparation method of a photovoltaic cell is further provided according to another embodiment of the present disclosure, which is used to prepare the photovoltaic cell provided according to the aforementioned embodiment. The preparation method of the photovoltaic cell provided according to another embodiment of the present disclosure will be described in detail below with reference to the accompanying drawings. It should be noted that the same or corresponding parts as the aforementioned embodiments are not described in detail here.

With reference to FIGS. 12 to 16 and FIG. 2, the preparation method of the photovoltaic cell includes the following steps: S101: providing a substrate 100 having a first surface 110; S102: forming an initial passivation layer 141 covering the first surface 110; S103: removing a part of the initial passivation layer 141 by a laser film removing process to form a groove 111 exposing the first surface 110 on the initial passivation layer 141, in which remaining initial passivation layer 141 serves as a passivation layer 101, and the passivation layer 101 has a sidewall 101*a* forming the groove 111; S104: printing a low-fire-through paste at least in the groove 111 by a first screen printing process; and S105: subjecting the low-fire-through paste to a laser-enhanced contact optimization treatment to transform the low-fire-through paste into a grid line 102 in ohmic contact with a part of the first surface 110 exposed by the groove 111, in which a gap 103 is formed between the grid line 102 at least partially located in the groove 111 and the sidewall 101*a* along a first direction X.

Figure 12:
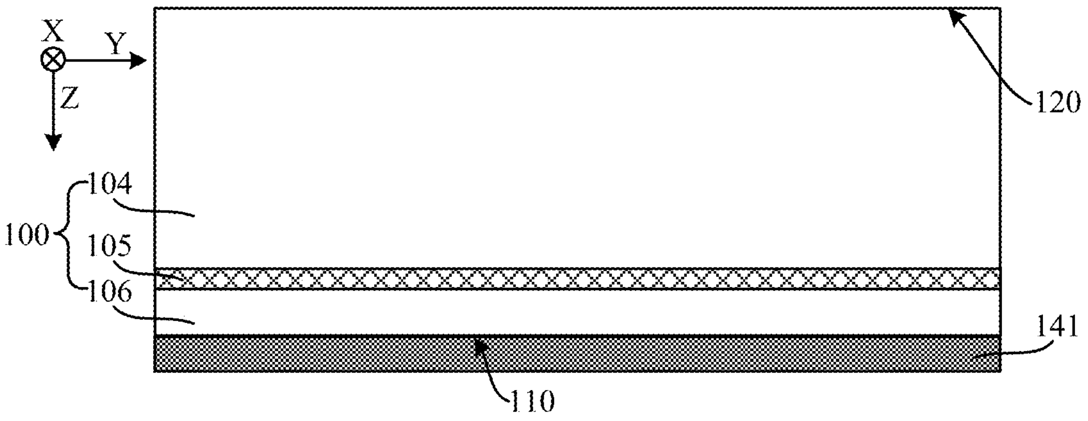
FIG. 12 is a partial cross-sectional view of forming an initial passivation layer in a preparation method of a photovoltaic cell according to another embodiment of the present disclosure.
Figure 13:
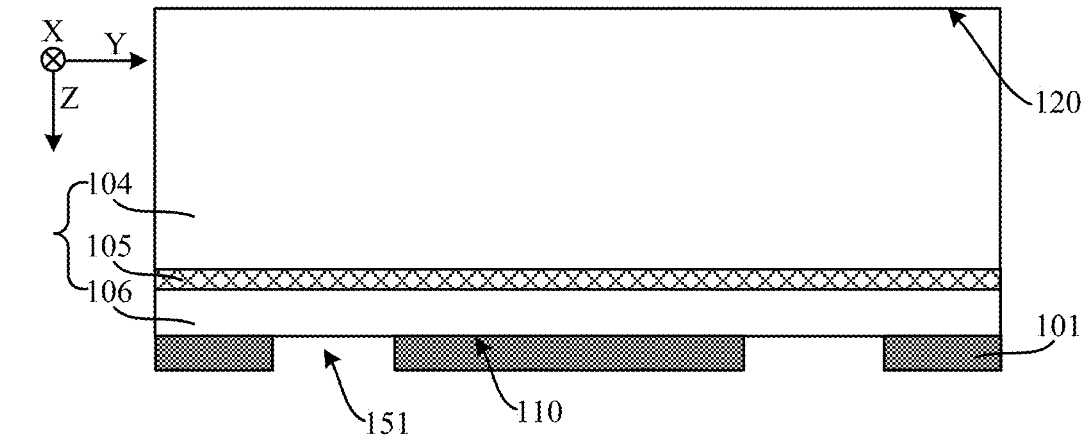
FIG. 13 is a first partial cross-sectional view of forming an initial groove in a preparation method of a photovoltaic cell according to another embodiment of the present disclosure.
Figure 14:
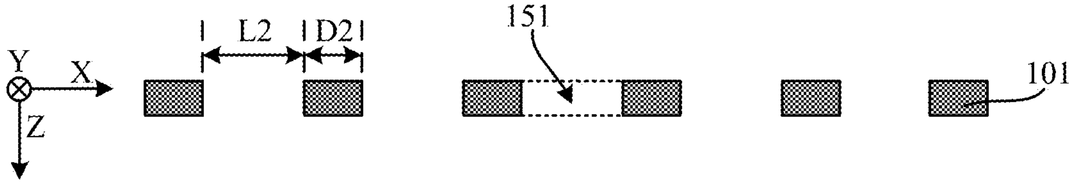
FIG. 14 is a second partial cross-sectional view of forming an initial groove in a preparation method of a photovoltaic cell according to another embodiment of the present disclosure.
Figure 15:
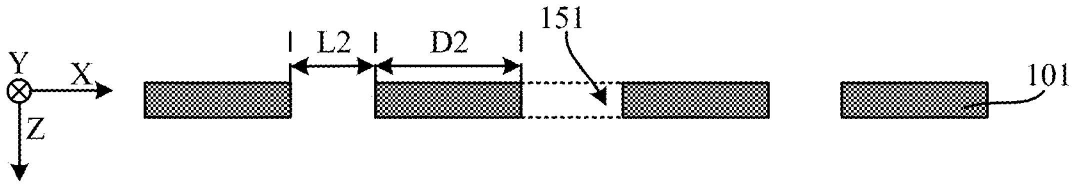
FIG. 15 is a third partial cross-sectional view of forming an initial groove in a preparation method of a photovoltaic cell according to another embodiment of the present disclosure.
Figure 16:
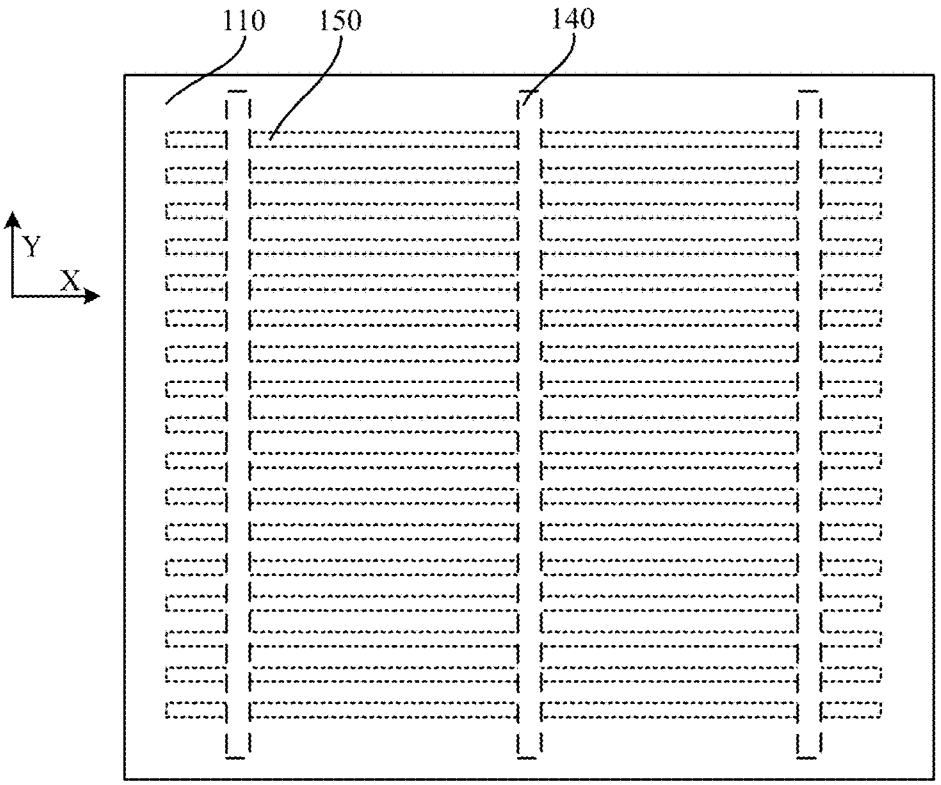
FIG. 16 is a partial top view of a first surface of a substrate in a preparation method of a photovoltaic cell according to another embodiment of the present disclosure.

FIG. 12 is a partial cross-sectional view of forming an initial passivation layer in a preparation method of a photovoltaic cell according to another embodiment of the present disclosure. FIG. 13 is a first partial cross-sectional view of forming an initial groove in a preparation method of a photovoltaic cell according to another embodiment of the present disclosure. FIG. 14 is a second partial cross-sectional view of forming an initial groove in a preparation method of a photovoltaic cell according to another embodiment of the present disclosure. FIG. 15 is a third partial cross-sectional view of forming an initial groove in a preparation method of a photovoltaic cell according to another embodiment of the present disclosure. FIG. 16 is a partial top view of a first surface of a substrate in a preparation method of a photovoltaic cell according to another embodiment of the present disclosure.

It should be note that since the grid line 102 is prepared by the low-fire-through paste with a lower preparation cost, the low-fire-through paste is not required to penetrate the passivation layer 101 by on its own fire-through performance so as to directly contact the first surface 110. Prior to preparing the grid line 102, a part of the initial passivation layer 141 is removed in advance by the laser film removing process to expose the first surface 110, such that the subsequently formed grid line 102 is in direct contact with the first surface 110. Furthermore, the low-fire-through paste is subjected to the laser-enhanced contact optimization treatment to form the grid line 102 in ohmic contact with the first surface 110. After the laser-enhanced contact optimization treatment, the low-fire-through paste enables the grid line 102 to include the low-fire-through conductive material.

When the grid line is prepared by the high-fire-through paste with a higher preparation cost, it is required to penetrate the passivation layer by the fire-through performance of the high-fire-through paste itself so as to directly contact the first surface, and the fire-through degree of the high-fire-through paste is difficult to control. There are too many uncertain factors in the contact interface between the high-fire-through paste and the passivation layer, and excessive reliance on factors such as the fire-through performance of the high-fire-through paste. In contrast, in the preparation method provided according to another embodiment of the present disclosure, on the one hand, the laser film removing process with higher precision is used to form an initial groove 151 on the initial passivation layer 141, without excessive reliance on the fire-through performance of the low-fire-through paste. Furthermore, the characteristics of the laser film removing process enables a more controllable morphology of the initial groove 151, thereby enabling a more controllable morphology of the groove 111 that is subsequently formed based on the initial groove 151. On the other hand, the low-fire-through paste with a lower preparation cost is used to prepare the grid line 102, and the low-fire-through paste is subject to the laser-enhanced contact optimization treatment, such that the low-fire-through paste is formed in the initial groove 151 without causing excessive erosion to the initial groove 151, and the low-fire-through paste can be in ohmic contact with the first surface 110.

Accordingly, the cooperation of the laser film removing process, the printing of the low-fire-through paste, and the laser-enhanced contact optimization has the following three advantages. Firstly, it is beneficial to avoid excessive erosion to the initial passivation layer 141 and the substrate 100 by the low-fire-through paste. Secondly, it facilitates the formation of good ohmic contact between the grid line 102 and the first surface 110 by virtue of the groove 111. Thirdly, it is also beneficial to reduce the preparation cost of the grid line 102, and to thin the thickness of the initial passivation layer 151, thereby further reducing the preparation cost of the passivation layer 101 and reducing the parasitic absorption of light by the passivation layer 101. It can be seen that based on improvements in these aspects, the preparation method provided according to another embodiment of the present disclosure beneficial to improve the photoelectric conversion efficiency of the photovoltaic cell while reducing the preparation cost of the photovoltaic cell.

Each step of the preparation method of the photovoltaic cell is described in detail below.

In some embodiments, the substrate 100 has a front side and a back side that are opposed.

In some cases, referring to FIGS. 1 and 12 to 13, the first surface 110 can be the back side, the substrate 100 can include a base 104, a tunneling layer 105, and a doped conductive layer 106 that are sequentially stacked, and the first surface 110 is a surface of the doped conductive layer 106 away from the tunneling layer 105.

In some other cases, referring to FIG. 3, the first surface 110 can be the front side, the substrate 100 includes an emitter 107, and the first surface 110 includes a surface of the emitter 107.

In some other cases, referring to FIG. 4, the first surface 110 can be the back side, the front side of the substrate 100 can be regarded as the second surface 120, in which case the preparation method can further include performing steps S102 to S105 on the second surface 120.

The passivation layer 101 finally formed on the first surface 110 can be regarded as a back passivation layer, the groove 111 finally formed on the passivation layer 101 can be regarded as a back groove, and the grid line 102 formed in ohmic contact with the first surface 110 can be regarded as a back grid line. A front passivation layer 108 is finally formed on the second surface 120. The front passivation layer 108 has a front groove 118 exposing the second surface 120, and the front passivation layer 108 has a front sidewall 108*a* forming the front groove 118. A front grid line 109 is located in the front groove 118 and located on a part of the surface of the front passivation layer 108 away from the substrate 100. A front gap 113 is formed between the front grid line 109 at least partially located in the front groove 118 and the front sidewall 108*a* along the first direction X. A material of the front grid line 109 includes the low-fire-through conductive material.

It should be noted that in practical applications, the first surface can also be the front side, and the back side of the substrate can be regarded as the second surface, in which case the preparation method can further include performing steps S102 to S105 on the second surface.

In some embodiments, in step S102, referring to FIG. 12, the initial passivation layer 141 is formed on the first surface 110 by a coating process. In practical applications, the preparation method can also include preparing a similar initial passivation layer on the second surface.

In some examples, the coating process includes a chemical vapor deposition process or a physical vapor deposition process, and a process temperature of the coating process is 200° C. to 600° C. For example, the process temperature of the coating process is 400° C. to 550° C.

In some examples, a material of the initial passivation layer 141 includes at least one of silicon nitride, aluminum oxide, silicon oxynitride, or silicon oxide.

The specific morphology of the initial groove 151 formed on the initial passivation layer 141 in step S103 is described in detail below. It should be noted that the specific morphology of the initial groove 151 is similar to the specific morphology of the groove 111 finally formed, and the same or corresponding parts of the initial groove 151 and the groove 111 in the aforementioned embodiments will not be described in detail here.

In some embodiments, with reference FIGS. 12 and 14, the step of removing the part of the initial passivation layer 141 by the laser film removing process can include: preparing the initial groove 151 on the initial passivation layer 141 in a continuous punctate film removing manner along the first direction X. In other words, a plurality of initial grooves 151 spaced apart along the first direction X are formed on the initial passivation layer 141. A second spacing D2 is formed between adjacent two initial grooves 151 along the first direction X. A ratio of a second length L2 of the initial groove 151 in the first direction X to the second spacing D2 ranges from 1/5 to 10/1. For example, the ratio of the two can be 1/4, 1/3, 1/2, 1, 2, 3, 4, 5, 6, 7, 8, or 9, etc.

Based on this, in step S104, the initial grid line formed by printing the low-fire-through paste extends along the first direction X, and one initial grid line is located in the plurality of initial grooves 151. It should be noted that one initial groove 151 is indicated by dashed lines in FIG. 14.

In some other embodiments, with reference FIGS. 12 and 15, the step of removing the part of the initial passivation layer 141 by the laser film removing process can include: preparing the initial groove 151 on the initial passivation layer 141 in a line segment film removing manner along the first direction X. In other words, a plurality of initial grooves 151 spaced apart along the first direction X are formed on the initial passivation layer 141. A second spacing D2 is formed between adjacent two initial grooves 151 along the first direction X. A ratio of a second length L2 of the initial groove 151 in the first direction X to the second spacing D2 ranges from 1/40 to 5/1. For example, the ratio of the two can be 1/35, 1/30, 1/25, 1/20, 1/15, 1/10, 1/5, 1, 1.5, 2, 2.5, 3, 3.5, 4, or 4.5, etc.

Based on this, in step S104, the initial grid line formed by printing the low-fire-through paste extends along the first direction X, and one initial grid line is located in the plurality of initial grooves 151. It should be noted that one initial groove 151 is indicated by dashed lines in FIG. 15.

In some other embodiments, with reference to FIGS. 12 and 6, the step of removing the part of the initial passivation layer 141 by the laser film removing process can include: forming an initial groove 151 along the first direction X that penetrates the initial passivation layer 141 along the first direction X.

Based on this, in step S104, the initial grid line formed by printing the low-fire-through paste extends along the first direction X, and one initial grid line is located in one initial groove 151.

In the aforementioned three embodiments, in step S103, a width of the initial groove 151 along the second direction Y perpendicular to the first direction X is a laser film removing line width; in step S104, a width of the low-fire-through paste printed by the first screen printing process along the second direction Y is a printing line width. The laser film removing line width is greater than the printing line width. In this way, in the first screen printing process, the low-fire-through paste with a narrower width is prone to be accurately printed into the initial groove 151 with a wider width, which is beneficial to improve the alignment accuracy between the initial groove 151 and the low-fire-through paste printed by the first screen printing process, so as to ensure sufficient ohmic contact area between the grid line 102 and the first surface 110, thereby beneficial to improve the yield rate of the prepared photovoltaic cell.

It should be noted that, with reference FIGS. 13 and 2, the laser film removing line width determines the width of the initial groove 151 along the second direction Y, which in turn determines the second width W2 of the groove 111 finally formed (referring to FIG. 5), thus the same or corresponding parts of the laser film removing line width and the second width W2 of the groove 111 in the aforementioned embodiments will not be described in detail here. The printing line width determines the first width W1 of the grid line 102 finally formed (referring to FIG. 5), thus the same or corresponding parts of the printing line width and the first width W1 of the grid line 102 in the aforementioned embodiments will not be described in detail here.

In some embodiments, in step S104, the low-fire-through paste includes copper and silver, and a content of copper in the low-fire-through paste is greater than or equal to a content of silver in the low-fire-through paste. Furthermore, the low-fire-through paste can further include a filler, and the filler mainly includes glass or resin. It should be noted that the low-fire-through paste is transformed into the grid line 102 including the low-fire-through conductive material after the laser-enhanced contact optimization treatment, and the same or corresponding parts of the low-fire-through paste and the low-fire-through conductive material in the aforementioned embodiments will not be described in detail here.

In some examples, in the step of printing the low-fire-through paste including copper and silver by the first screen printing process, the printing line width can be 5 μm to 100 μm.

In some examples, in the step of removing the part of the initial passivation layer 141 by the laser film removing process, the laser film removing line width can be 10 μm to 300 μm.

In some embodiments, after step S104 and prior to step S105, the preparation method can further include: subjecting the low-fire-through paste to a drying treatment and a curing treatment to transform the low-fire-through paste into the initial grid line with a stable shape.

In some examples, in the step of the drying treatment, a drying temperature used is 100° C. to 400° C. For example, the drying temperature can be 150° C., 200° C., 250° C., 300° C., or 350° C., etc.

In some examples, in the step of the curing treatment, a curing temperature used is 150° C. to 350° C. For example, the curing temperature can be 180° C., 200° C., 240° C., 250° C., 275° C., 300° C., or 320° C., etc. A curing time is 3 min to 30 min. For example, the curing time can be 8 min, 10 min, 15 min, 20 min, 25 min, or 28 min, etc.

In some embodiments, referring to FIG. 13, after the first screen printing process (step S104) and prior to the laser-enhanced contact optimization treatment (step S105), a contact resistivity between the low-fire-through paste and the first surface 110 is a first resistivity. After the laser-enhanced contact optimization treatment (step S105), a contact resistivity between the low-fire-through paste and the first surface 110 is a second resistivity, i.e. a contact resistivity between the grid line 102 and the first surface 110 is the second resistivity. The second resistivity is less than the first resistivity. In the step of the laser-enhanced contact optimization treatment, a contact resistivity between the low-fire-through paste and the first surface is reduced from the first resistivity to the second resistivity.

It should be noted that in step S103, forming the initial groove 151 on the initial passivation layer 141 can be regarded as an alternative for the step of penetrating the passivation layer by the fire-through performance when the high-fire-through paste is used, such that prior to subjecting the low-fire-through paste to the laser-enhanced contact optimization treatment, the low-fire-through paste can achieve direct contact with the first surface 110, further ensuring good ohmic contact between the low-fire-through paste and the first surface 110 during the step of the laser-enhanced contact optimization treatment. During the step of the laser-enhanced contact optimization treatment, a local current generated in the photovoltaic cell will significantly reduce the contact resistivity between the grid line 102 and the first surface 110, that is, the contact resistivity between the low-fire-through paste and the first surface 110 is reduced from the first resistivity to the second resistivity, which is beneficial to improve the photoelectric conversion efficiency of the photovoltaic cell.

In some examples, the first resistivity is greater than 10 $m\Omega \cdot cm^2$, and the second resistivity is less than 5 $m\Omega \cdot cm^2$.

In some examples, the step of subjecting the low-fire-through paste to the laser-enhanced contact optimization treatment can include scanning the photovoltaic cell with a processing light source and applying a reverse bias voltage to the grid line 102 at the same time, at least one of infrared light, red light, and green light is used as the processing light source.

In one example, the reverse bias voltage can be 10V to 20V.

In one example, the step of scanning the photovoltaic cell with the processing light source can include: scanning a surface of the photovoltaic cell where the grid line 102 is located with the processing light source.

In some embodiments, the laser-enhanced contact optimization treatment includes at least one laser-enhanced contact optimization process.

In the LECO (Laser-enhanced contact optimization) treatment, the processing light source can be infrared light, red light, green light, or various composite light sources, and the reverse bias applied is 10V to 20V. Optionally, after treating the front side, the silver-coated copper grid line on the back side can be subjected to a second LECO treatment. In the second treatment, the TOPCon cell is optionally front side up or back side up.

It should be noted that if the contact resistivity between the grid line 102 and the first surface 110 is not low enough after one laser-enhanced contact optimization treatment, the grid line 102 can be subjected to a second or even a third laser-enhanced contact optimization treatment to make the contact resistivity between the grid line 102 and the first surface 110 meet the expected requirements. Therefore, in practical applications, the number of times the laser-enhanced contact optimization treatment performed in the laser-enhanced contact optimization treatment can be designed as required.

In some examples, if the laser-enhanced contact optimization treatment includes more than one laser-enhanced contact optimization treatment, the processing light source can scan different surfaces of the photovoltaic cell in different laser-enhanced contact optimization treatments. For example, in some laser-enhanced contact optimization treatments, the processing light source scans the surface of the photovoltaic cell where the grid line 102 is located, while in other laser-enhanced contact optimization treatments, the processing light source scans the other surface of the photovoltaic cell opposite to the surface where the grid line 102 is located. In other words, both the front and back sides of the photovoltaic cell are subjected to scanning by the processing light source.

In practical applications, in different laser-enhanced contact optimization treatments, the processing light source can also scan the front side of the photovoltaic cell or the back side of the photovoltaic cell.

It should be noted that the grid line 102 in ohmic contact with the first surface 110 formed in step S105 can be a busbar, a finger, or a busbar and a finger. The preparation processes of the grid line 102 in various cases are described in detail below.

In some embodiments, referring to FIG. 16, the first surface 110 includes a first region 140 and a second region 150. The first region 140 extends along the second direction Y, the second region 150 extends along the first direction X, and the first direction X intersects the second direction Y. With reference to FIGS. 16, 12, 13, the step of removing the part of the initial passivation layer 141 by the laser film removing process (step S103) includes: removing the initial passivation layer 141 located on the second region 150. Prior to printing the low-fire-through paste (step S104), the preparation method can further include: printing the fire-through paste on the initial passivation layer 141 located in the first region 140 by a second screen printing process.

It should be noted that the first region 140 is indicated by a sparse dashed box and the second region 150 is indicated by a dense dashed box in FIG. 16 in order to clearly indicate the approximate positions of the first region 140 and the second region 150 on the first surface 110.

It should be noted that the fire-through paste printed by the second screen printing process is different from the low-fire-through paste printed by the first screen printing process. The fire-through paste printed by the second screen printing process has a stronger fire-through ability to the initial passivation layer 141. For example, the fire-through paste printed by the second screen printing process can be the high-fire-through paste described in the aforementioned embodiments.

It should be noted that the first surface 110 includes a busbar and a finger, the first region 140 is in ohmic contact with the busbar formed subsequently, and the second region 150 is in ohmic contact with the finger formed subsequently. The grid line 102 formed in step S104 can be regarded as the finger on the first surface 110.

In some cases, after printing the fire-through paste and prior to printing the low fire-through paste (step S104), the preparation method can further include: subjecting the fire-through paste to a high-temperature sintering treatment, such that the fire-through paste penetrates the initial passivation layer 141 along the direction Z to make ohmic contact with the first region 140.

In some examples, process parameters for the high-temperature sintering treatment of the fire-through paste can include: a high-temperature sintering temperature of about 400° C. to 700° C.; a light annealing temperature of about 200° C. to 400° C.; and a light intensity equivalent to 1 to 30 suns.

It should be noted that when the busbar on the first surface 110 is prepared by the fire-through paste, and the finger is prepared by the low-fire-through paste, the laser film removing process is performed firstly to remove an area located on the first surface 110 that is required to be in contact connection with the finger, i.e. the initial passivation layer 141 of the second region 150, so as to form the initial groove 151 that facilitates formation of ohmic contact between the low-fire-through paste and the second region 150; and the busbar is prepared by the second screen printing process, then the grid line 102, i.e. the finger, is prepared by the first screen printing process based on the initial groove 151. In this way, the laser film removing process is advanced to prior to the preparation of the busbar and the finger, which avoids laser damage to the already formed busbar compared with performing the laser film removing process after the busbar is formed, thereby avoiding adverse effects on the photoelectric conversion efficiency of the photovoltaic cell.

In some other embodiments, with continued reference to FIG. 16, the first surface 110 can include a first region 140 and a second region 150. The first region 140 extends along the second direction Y, the second region 150 extends along the first direction X, and the first direction X intersects the second direction Y. With reference to FIGS. 16, 12, and 13, the step of removing the part of the initial passivation layer 141 by the laser film removing process (step S103) can include: removing the initial passivation layer 141 located on the first region 140 and the second region 150.

It should be noted that the first surface 110 includes a busbar and a finger, the first region 140 is in ohmic contact with the busbar formed subsequently, and the second region 150 is in ohmic contact with the finger formed subsequently. The grid line 102 formed in step S104 can be regarded as the finger and the finger on the first surface 110.

In some other embodiments, referring to FIG. 4, the substrate 100 further includes the second surface 120 opposite to the first surface 110 along the direction Z, one of the first surface 110 and the second surface 120 is the front side of the substrate 100, and the other is the back side of the substrate 100. Taking the first surface 110 as the back side of the substrate as an example, detailed description is set out below.

In some cases, referring to FIG. 4, steps S102 to S105 are performed on the second surface 120, a front passivation layer 108 having a front groove 118 exposing the second surface 120 is finally formed on the second surface 120, and a front grid line 109 located in the front groove 118 and located on a part of a surface of the front passivation layer 108 away from the substrate 100 is formed. It should be noted that, like the grid line 102 located on the first surface 110 described in the aforementioned embodiments, the front grid line 109 includes a busbar, a finger, or a busbar and a finger.

In other cases, with reference to FIGS. 16 and 12, in the step of printing the fire-through paste on the initial passivation layer 141 located in the first region 140 by the second screen printing process, the fire-through paste is further printed on the second surface 120 to form the grid line located on the second surface. The step of subjecting the fire-through paste to the high-temperature sintering treatment further includes subjecting the printed fire-through paste printed on the second surface 120 to the high-temperature sintering treatment.

It should be noted that regardless of whether the surface is the first surface 110 or the second surface 120, if the low-fire-through paste is used to prepare the grid line that is in ohmic contact with the surface, it is required to perform steps S103 to S105; if the fire-through paste is used to prepare the grid line that is in ohmic contact with the surface, it is required to print the fire-through paste by the second screen printing process, and subject the fire-through paste to the high-temperature sintering treatment.

In conclusion, the cooperation of the laser film removing process, the printing of the low-fire-through paste, and the laser-enhanced contact optimization has the following four advantages. Firstly, it is beneficial to avoid excessive erosion to the initial passivation layer 141 and the substrate 100 by the low-fire-through paste. Secondly, it facilitates the formation of good ohmic contact between the grid line 102 and the first surface 110. Thirdly, it is also beneficial to reduce the preparation cost of the grid line 102, and to thin the thickness of the initial passivation layer 141, thereby further reducing the preparation cost of the passivation layer 101 and reducing the parasitic absorption of light by the passivation layer 101. Fourthly, the laser film removing line width is greater than the printing line width, which is beneficial to improve the alignment accuracy between the initial groove 151 and the low-fire-through paste printed by the first screen printing process. Based on improvements in these aspects, the preparation method provided according to another embodiment of the present disclosure is beneficial to improve the photoelectric conversion efficiency of the photovoltaic cell while reducing the preparation cost of the photovoltaic cell.

A photovoltaic module is provided according to yet another embodiment of the present disclosure, which is used to convert received light energy into electrical energy. The preparation method of the photovoltaic cell provided according to another embodiment of the present disclosure will be described in detail below with reference to the accompanying drawings. It should be noted that the same or corresponding parts as the aforementioned embodiments are not described in detail here.

Figure 17:
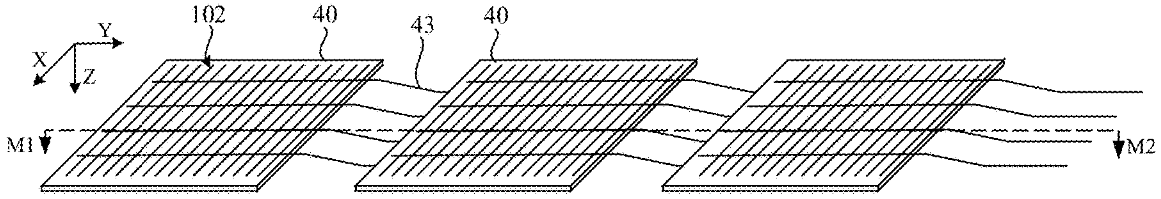
FIG. 17 is a partial perspective view of a photovoltaic module according to yet another embodiment of the present disclosure.
Figure 18:
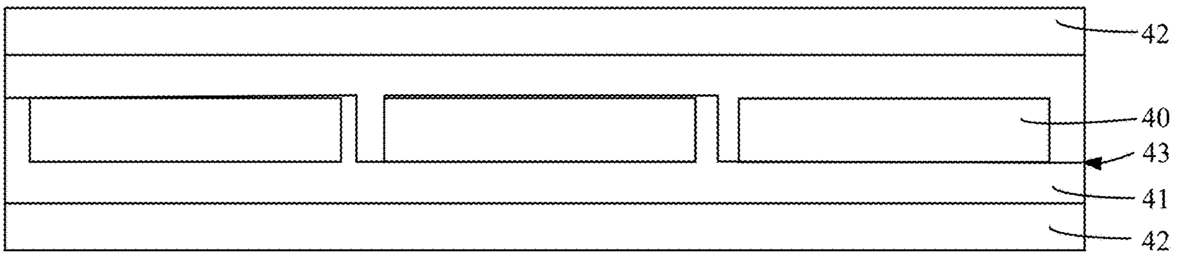
FIG. 18 is a cross-sectional view taken along line M1-M2 of FIG. 17.

FIG. 17 is a partial perspective view of a photovoltaic module provided according to yet another embodiment of the present disclosure. FIG. 18 is a cross-sectional view along the M1-M2 section of FIG. 17.

With reference to FIGS. 17 and 18, the photovoltaic module includes: a cell string formed by connecting a plurality of photovoltaic cells 40 as provided according to the aforementioned embodiments, or formed by connecting a plurality of photovoltaic cells 40 prepared by the preparation method provided according to the aforementioned embodiments; a packaging film 41 configured to cover a surface of the cell string; and a cover plate 42 configured to cover a surface of the packaging film 41 away from the cell string.

In some embodiments, referring to FIG. 18, the plurality of cell strings can be electrically connected via a solder strip 43. FIG. 18 only shows one positional relationship between photovoltaic cells, that is, the electrodes with the same polarity of the cells are arranged in the same direction, or the electrodes with positive polarity of each cell are arranged facing the same side, such that the solder strip 43 connects different sides of adjacent two cells. In some embodiments, the cells can also be arranged with electrodes of different polarities facing the same side, that is, the electrodes of adjacent cells are arranged in a sequence of first polarity, second polarity, and first polarity, thus the solder strip connects adjacent two cells on the same side.

In some embodiments, no gap is formed between the cells, that is, the cells overlap each other.

In some embodiments, referring to FIG. 18, the packaging film 41 includes a first packaging layer and a second packaging layer, the first packaging layer covers one of the front side and the back side of the photovoltaic cell 40, and the second packaging layer covers the other of the front side and the back side of the photovoltaic cell 40. Specifically, at least one of the first packaging layer and the second packaging layer can be an organic packaging film such as polyvinyl butyral (PVB) film, ethylene-vinyl acetate copolymer (EVA) film, polyethylene octene co-elastomer (POE) film, or polyethylene terephthalate (PET) film.

In some cases, the first packaging layer and the second packaging layer have a boundary therebetween prior to lamination, and after lamination, the photovoltaic module is formed and there is no longer the concept of the first packaging layer and the second packaging layer, that is, the first packaging layer and the second packaging layer have formed the integral packaging film 41.

In some embodiments, referring to FIG. 18, the cover plate 42 can be a glass cover plate, a plastic cover plate or the like with light-transmitting function. Specifically, a surface of the cover plate 42 facing the packaging film 41 can be a concave-convex surface, so as to increase the utilization rate of the incident light. The cover plate 42 includes a first cover plate and a second cover plate. The first cover plate is opposite to the first packaging layer, and the second cover plate is opposite to the second packaging layer.

In some embodiments, the photovoltaic cell 40 includes, but is not limited to, one of PERC cell (Passivated Emitter Rear Cell), IBC cell (Interdigitated Back Contact Cell), TOPCon cell (Tunnel Oxide Passivated Contact Cell), HIT/HJT cell (Heterojunction Technology cell), thin-film solar cell, tandem cell, or any combination thereof. The thin-film solar cell includes, but is not limited to, perovskite thin-film solar cell, copper indium selenide thin-film solar cell, gallium arsenide thin-film solar cell, and cadmium sulfide thin-film solar cell. The tandem cell includes, but is not limited to, perovskite-crystalline silicon tandem cell, perovskite-perovskite tandem cell, and perovskite-thin-film tandem cell.

It can be understood by those of ordinary skill in the art that the aforementioned embodiments are specific examples for implementing the present disclosure, and in practical applications, various changes can be made in form and detail without departing from the spirit and scope of the embodiments of the present disclosure. Various changes and modifications can be made by those skilled in the art without departing from the spirit and scope of the embodiments of the present disclosure, the protection scope of the embodiments of the present disclosure shall therefore be subjected to the scope defined in the claims.

What is claimed is:

1. A photovoltaic cell, comprising:

a substrate having a first surface;

a passivation layer located on the first surface, wherein the passivation layer has a groove exposing the first surface, and the passivation layer has a sidewalls forming the groove; and a grid line extending along a first direction, wherein the grid line is at least partially located in the groove and is in ohmic contact with a part of the first surface exposed by the groove, and a gap is formed between the grid line at least partially located in the groove and the sidewalls along the first direction;

wherein a material of the grid line comprises a low-fire-through conductive material, wherein, in a direction along which the substrate points to the grid line, an area of the groove corresponding to an end portion of the groove is a first sub-groove, an area of the groove corresponding to a middle portion of the groove is a second sub-groove, and a third sub-width of the first sub-groove is greater than or equal to a fourth sub-width of the second sub-groove.

2. The photovoltaic cell according to claim 1, wherein taking a plane where the first surface is located as a reference plane, an angle between the sidewalls and the reference plane is 45° to 150°.

3. The photovoltaic cell according to claim 1, wherein a surface roughness of the sidewalls is less than or equal to 6.3 μm.

4. The photovoltaic cell according to claim 1, wherein the low-fire-through conductive material comprises copper and silver, a content of copper in the low-fire-through conductive material is a first content, a content of silver in the low-fire-through conductive material is a second content, and a ratio of the first content to the second content is in a range from 1 to 9.

5. The photovoltaic cell according to claim 4, wherein the first content ranges from 50% to 90%.

6. The photovoltaic cell according to claim 1, wherein along a second direction perpendicular to the first direction, a first width of the grid line is less than a second width of the groove.

7. The photovoltaic cell according to claim 1, wherein the grid line extends along the first direction, the grid line has two end portions and a middle portion connecting the two end portions along the first direction; wherein along a second direction perpendicular to the first direction, a first sub-width of the end portion is greater than or equal to a second sub-width of the middle portion.

8. The photovoltaic cell according to claim 1, wherein the grid line comprises a bottom portion, a transition portion, and a top portion that are sequentially connected in a direction along which the substrate points to the grid line, the bottom portion is in ohmic contact with the first surface.

9. The photovoltaic cell according to claim 8, wherein the bottom portion comprises silver crystallites, the transition portion comprises silver particles, the top portion comprises silver-coated copper particles, and a size of the silver crystallites is less than a size of the silver particles.

10. The photovoltaic cell according to claim 1, wherein a contact resistivity between the grid line and the first surface is less than 5 $m\Omega \cdot cm^2$.

11. The photovoltaic cell according to claim 1, wherein an orthographic projection of the grid line on the substrate is located in an orthographic projection of the groove corresponding to the grid line on the substrate.

12. The photovoltaic cell according to claim 1, wherein the first surface comprises a first part covered with the passivation layer, a second part exposed by the gap, and a third part covered with the grid line, an area of the first part is greater than an area of the second part, and the area of the second part is greater than an area of the third part.

13. The photovoltaic cell according to claim 1, wherein the substrate has a second surface opposite to the first surface, the photovoltaic cell further comprises:

a front passivation layer located on the second surface, wherein the front passivation layer has a front groove exposing the second surface, and the front passivation layer has front sidewalls forming a front groove; and a front grid line, wherein the front grid line is at least partially located in the front groove and is in ohmic contact with a part of the second surface exposed by the front groove, and a front gap is formed between the front grid line at least partially located in the front groove and the front sidewalls along the first direction, wherein a material of the front grid line comprises the low-fire-through conductive material.

14. The photovoltaic cell according to claim 1, wherein the grid line is formed by laser-enhanced contact optimization of the low-fire-through conductive material.

15. A photovoltaic cell, comprising:

a substrate having a first surface;

a passivation layer located on the first surface, wherein the passivation layer has a groove exposing the first surface, and the passivation layer has sidewalls forming the groove; and a grid line extending along a first direction, wherein the grid line is at least partially located in the groove and is in ohmic contact with a part of the first surface exposed by the groove, and a gap is formed between the grid line at least partially located in the groove and the sidewalls along the first direction;

wherein a material of the grid line comprises a low-fire-through conductive material, wherein the passivation layer has a plurality of grooves, including the groove, spaced apart along the first direction, the grid line is located in the plurality of grooves; a first spacing is formed between adjacent two grooves along the first direction, and a ratio of a first length of the groove in the first direction to the first spacing ranges from 1/40 to 10/1.

16. A photovoltaic cell, comprising:

a substrate having a first surface;

a passivation layer located on the first surface, wherein the passivation layer has a groove exposing the first surface, and the passivation layer has sidewalls forming the groove; and a grid line extending along a first direction, wherein the grid line is at least partially located in the groove and is in ohmic contact with a part of the first surface exposed by the groove, and a gap is formed between the grid line at least partially located in the groove and the sidewalls along the first direction;

wherein a material of the grid line comprises a low-fire-through conductive material, wherein the passivation layer has a plurality of grooves, including the groove, and wherein a part of the grid line is located on a surface of the passivation layer between adjacent grooves of the plurality of grooves along the first direction.

17. A photovoltaic module, comprising:

a cell string formed by connecting a plurality of photovoltaic cells according to claim 1;

a packaging film configured to cover a surface of the cell string; and a cover plate configured to cover a surface of the packaging film away from the cell string.

* * * * *